(12) United States Patent
Wang et al.

(10) Patent No.: US 12,191,336 B2
(45) Date of Patent: Jan. 7, 2025

(54) IMAGE SENSOR HAVING A GATE DIELECTRIC STRUCTURE FOR IMPROVED DEVICE SCALING

(71) Applicant: Taiwan Semiconductor Manufacturing Company, Ltd., Hsinchu (TW)

(72) Inventors: Tzu-Jui Wang, Fengshan (TW); Dun-Nian Yaung, Taipei (TW); Chen-Jong Wang, Hsin-Chu (TW); Ming-Chieh Hsu, Hsinchu (TW); Wei-Cheng Hsu, Kaohsiung (TW); Yuichiro Yamashita, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 417 days.

(21) Appl. No.: 17/750,784

(22) Filed: May 23, 2022

(65) Prior Publication Data
US 2023/0261021 A1    Aug. 17, 2023

Related U.S. Application Data

(60) Provisional application No. 63/310,402, filed on Feb. 15, 2022.

(51) Int. Cl.
*H01L 27/14*     (2006.01)
*H01L 27/146*    (2006.01)
*H04N 25/77*     (2023.01)

(52) U.S. Cl.
CPC .... *H01L 27/1463* (2013.01); *H01L 27/14614* (2013.01); *H01L 27/14643* (2013.01); *H01L 27/14689* (2013.01); *H04N 25/77* (2023.01)

(58) Field of Classification Search
None
See application file for complete search history.

(56) References Cited

U.S. PATENT DOCUMENTS

| | | | |
|---|---|---|---|
| 2017/0236859 A1 | 8/2017 | Otake et al. | |
| 2019/0115382 A1 | 4/2019 | Chou et al. | |
| 2020/0098798 A1* | 3/2020 | Takahashi | H01L 27/1461 |
| 2020/0266223 A1 | 8/2020 | Takahashi | |
| 2020/0266229 A1 | 8/2020 | Takahashi et al. | |
| 2020/0357837 A1 | 11/2020 | Tsao et al. | |

(Continued)

*Primary Examiner* — Bradley Smith
(74) *Attorney, Agent, or Firm* — Eschweiler & Potashnik, LLC

(57) ABSTRACT

Various embodiments of the present disclosure are directed towards an image sensor. The image sensor includes a deep trench isolation (DTI) structure disposed in a substrate. A pixel region of the substrate is disposed within an inner perimeter of the DTI structure. A photodetector is disposed in the pixel region of the substrate. A gate electrode structure overlies, at least partially, the pixel region of the substrate. A first gate dielectric structure partially overlies the pixel region of the substrate. A second gate dielectric structure partially overlies the pixel region of the substrate. The gate electrode structure overlies both a portion of the first gate dielectric structure and a portion of the second gate dielectric structure. The first gate dielectric structure has a first thickness. The second gate dielectric structure has a second thickness that is greater than the first thickness.

20 Claims, 22 Drawing Sheets

(56) References Cited

U.S. PATENT DOCUMENTS

2021/0272989 A1\* 9/2021 Lin .................. H01L 27/14627
2023/0317757 A1\* 10/2023 Chiang .............. H01L 27/1463
  257/446

\* cited by examiner

IMAGE SENSOR HAVING A GATE DIELECTRIC STRUCTURE FOR IMPROVED DEVICE SCALING

REFERENCE TO RELATED APPLICATION

This application claims the benefit of U.S. Provisional Application No. 63/310,402, filed on Feb. 15, 2022, the contents of which are incorporated herein by reference in their entirety.

BACKGROUND

Many modern day electronic devices (e.g., smartphones, digital cameras, biomedical imaging devices, automotive imaging devices, etc.) comprise image sensors. The image sensors comprise one or more photodetectors (e.g., photodiodes, phototransistors, photoresistors, etc.) configured to absorb incident radiation and output electrical signals corresponding to the incident radiation. Some types of image sensors include charge-coupled device (CCD) image sensors and complementary metal-oxide-semiconductor (CMOS) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
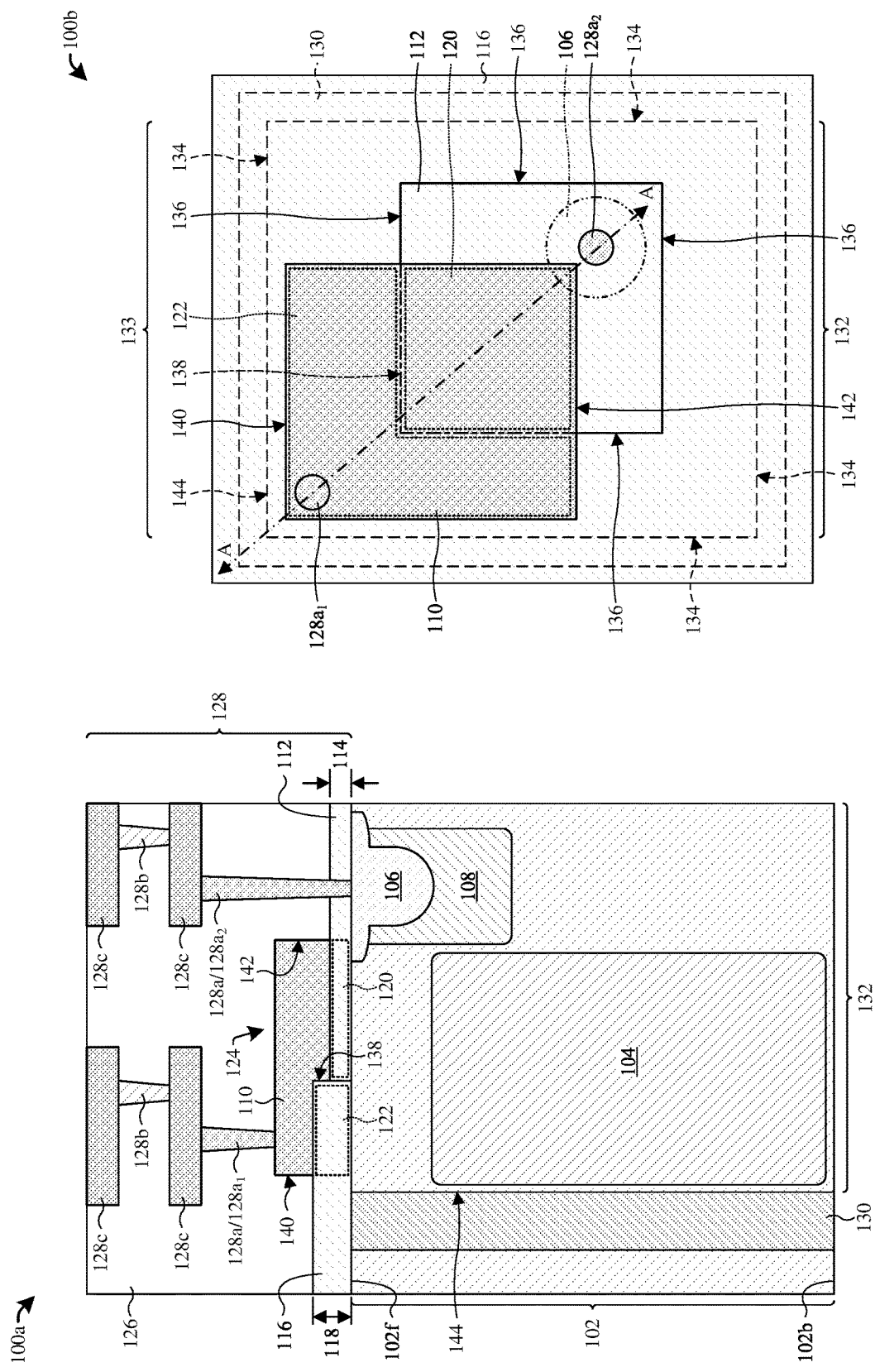
FIGS. 1A-1B illustrate various views of some embodiments of an image sensor comprising a first gate dielectric structure having a first thickness and a second gate dielectric structure having a second thickness greater than the first thickness.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, etc.) include an image sensor for capturing images. One example of such an image sensor is a complementary metal-oxide-semiconductor (CMOS) image sensor (CIS) having an array of pixel sensors. Each of the pixel sensors comprises a photodetector disposed in a substrate. Each of the pixel sensors comprise a transfer gate that is configured to transfer accumulated charges from the photodetector to a floating diffusion node. A back-side deep trench isolation (BDTI) structure is disposed in the substrate and laterally surrounds the photodetectors. The BDTI structure provides good electrical isolation between the photodetectors.

Typically, a shallow trench isolation (STI) structure and/or a contact etch stop layer (CESL) is required to form the BDTI structures. The STI structure is disposed in the substrate. The CESL is disposed over the front-side of the substrate and over the transfer gate. Due to the BDTI structure being formed from a back-side of the substrate, the STI structure and/or the CESL are needed to ensure the BDTI structure formation process has a safe landing area (e.g., an area near/on the front-side of the substrate that the etching process for forming the BDTI structure may land/stop without causing damage to other structures, such as a transfer gate, conductive contacts, etc.). Relying on the STI structure and/or the CESL to provide a safe landing area may negatively impact performance of the CIS (e.g., poor dark current performance, poor white pixel performance, poor full well capacity, etc.).

For example, for the STI structure to provide a safe landing area, the STI has to be relatively large (e.g., due to the difficulty in controlling overlay in the BDTI structure formation process). As a result, the STI consumes a large area of the CIS. Thus, the size (e.g., footprint) of the photodetector may have to be reduced, which may negatively impact performance of the CIS (e.g., reduce full well capacity performance). Further, the process for forming the STI structure (e.g., etching of the substrate) may cause damage to the substrate, which may further reduce the performance of the CIS (e.g., the damage may negatively impact dark current and/or white pixel performance). Moreover, a protective well region (e.g., p-well) is often utilized in combination with the STI structure to protect the STI structure and/or ensure proper passivation of the STI/substrate interface, which may further reduce the performance of the CIS (e.g., the protective well region consumes even more area which may further reduce full well capacity performance).

In another example, the CESL may be relied upon as a safe landing area (e.g., without the STI structure). In such an instance, a large area (e.g., a large lateral spacing) must be reserved between the BDTI structure and the conductive contact (e.g., metal contact) that extends (vertically) from the transfer gate. The large area is needed to ensure that the BDTI structure formation process does not damage the conductive contact (and/or the transfer gate), which may negatively impact performance of the CIS and/or reduce yield (e.g., due to destroying the functionality of the CIS during fabrication). For example, since the CESL is disposed over the transfer gate and the conductive contact penetrates the CESL, if the etching process of the BDTI formation process were to unintentionally occur beneath the conductive contact (e.g., due to the difficulty in controlling overlay), the etching process of the BDTI formation process may undesirably etch through the transfer gate and into the conductive contact, thereby damaging the conductive contact (and/or transfer gate). The large area restricts the location of the conductive contact and the back end of line (BEOL) routing (e.g., metal layer 1 routing). As a result, utilizing the CESL for the safe landing area may limit the ability to scale down the dimensions of CISs (e.g., limit the development of extremely small pixel pitch CISs).

Various embodiments of the present disclosure are related to an image sensor (e.g., CIS). The image sensor includes a deep trench isolation (DTI) structure disposed in a semiconductor substrate. A pixel region of the semiconductor substrate is disposed within an inner perimeter of the DTI structure. A photodetector is disposed in the pixel region of the semiconductor substrate. A gate electrode structure overlies, at least partially, the pixel region of the semiconductor substrate. A first gate dielectric structure partially overlies the pixel region of the semiconductor substrate. A second gate dielectric structure partially overlies the pixel region of the semiconductor substrate. The gate electrode structure overlies both a portion of the first gate dielectric structure and a portion of the second gate dielectric structure. The first gate dielectric structure has a first thickness. The second gate dielectric structure has a second thickness that is greater than the first thickness. A dielectric structure is disposed over the semiconductor substrate. A conductive contact is disposed in the dielectric structure and extends vertically from the gate electrode structure. The conductive contact overlies the portion of the second gate dielectric structure.

Because the second gate dielectric structure has the second thickness, the second gate dielectric structure may be utilized to provide a safe landing area for the process for forming the DTI structure. Therefore, in comparison to a typical CIS, a size of the gate electrode (e.g., the gate electrode of a transfer gate) may be increased and/or the gate electrode may be disposed nearer (in a lateral direction) to the DTI. Thus, in comparison to a typical CIS, the conductive contact may also be disposed nearer the DTI (and in some instances overlap the DTI). Further, because the gate electrode structure overlies both the portion of the first gate dielectric structure and the portion of the second gate dielectric structure, charges accumulated in the photodetector may be efficiently transferred from the photodetector to a floating diffusion node (e.g., if a transfer gate has a gate dielectric that is too thick near the floating diffusion node, the ability of the transfer gate to control the transfer of charges from the photodetector to the floating diffusion node may be negatively affected). Accordingly, the image sensor may improve the ability to scale down the dimensions of CISs.

FIGS. 1A-1B illustrate various views 100a-100b of some embodiments of an image sensor comprising a first gate dielectric structure 112 having a first thickness 114 and a second gate dielectric structure 116 having a second thickness 118 greater than the first thickness 114. More specifically, FIG. 1A illustrates a cross-sectional view 100a of some embodiments of an image sensor comprising a first gate dielectric structure having a first thickness and a second gate dielectric structure having a second thickness greater than the first thickness. FIG. 1B illustrates a layout view 100b of the image sensor illustrated in FIG. 1A. The cross-sectional view 100a of FIG. 1A is taken along line A-A of FIG. 1B.

As shown in the various views 100a-100b of FIG. 1A-1B, the image sensor comprises a substrate 102 (e.g., semiconductor substrate). The substrate 102 has a front side 102f and a back side 102b opposite the front side 102f. In some embodiments, the front side 102f of the substrate 102 is defined by a first surface (e.g., a front side surface), and the back side 102b of the substrate 102 is defined by a second surface (e.g., a back side surface) that is opposite the first surface. The substrate 102 may comprise any type of semiconductor body (e.g., monocrystalline silicon/CMOS bulk, silicon-germanium (SiGe), silicon on insulator (SOI), etc.). In some embodiments, the image sensor (e.g., back-side illumination image sensor) is configured to record incident radiation (e.g., photons) that passes through the back side 102b of the substrate 102.

A photodetector 104 (e.g., photodiode) is disposed in the substrate 102. The photodetector 104 comprises a portion of the substrate 102 having a first doping type (e.g., n-type/p-type). In some embodiments, portions of the substrate 102 adjoining the photodetector 104 have a second doping type opposite the first doping type (e.g., p-type/n-type), or may be intrinsic. The photodetector 104 is configured to absorb the incident radiation (e.g., light) and generate electrical signals corresponding to the incident radiation.

A floating diffusion node 106 is disposed in the substrate 102 and laterally spaced from the photodetector 104. The floating diffusion node 106 is a region of the substrate 102 having the first doping type. In some embodiments, a doped well 108 is disposed in the substrate 102. In further embodiments, the floating diffusion node 106 may be disposed in the doped well 108. The doped well 108 is a region of the substrate 102 having the second doping type.

A gate electrode structure 110 is disposed over the front side 102f of the substrate 102. The front side 102f of the substrate 102 is disposed vertically between the gate electrode structure 110 and the back side 102b of the substrate 102. In some embodiments, the gate electrode structure 110 is or comprises, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing.

A first gate dielectric structure 112 is disposed over the front side 102f of the substrate 102. The first gate dielectric structure 112 has a first thickness 114. In some embodiments, the first gate dielectric structure 112 is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing.

A second gate dielectric structure 116 is disposed over the front side 102f of the substrate 102. In some embodiments, the second gate dielectric structure 116 is disposed on a side of the first gate dielectric structure 112, as shown in the cross-sectional view 100a of FIG. 1A. The second gate dielectric structure 116 has a second thickness 118 that is greater than the first thickness 114. In some embodiments, the second gate dielectric structure 116 is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In some embodiments, the second gate dielectric structure 116 and the first gate dielectric structure 112 have a same chemical composition (e.g., $SiO_2$). In other embodiments, the first gate dielectric structure 112 and the second gate dielectric structure 116 may have different chemical compositions. In some embodiments, the second gate dielectric structure 116 laterally surrounds the first gate dielectric structure 112.

In some embodiments, the gate electrode structure 110 is or comprises polysilicon. In such embodiments, the first gate dielectric structure 112 and/or the second gate dielectric structure 116 may be or comprise, for example, an oxide (e.g., SiO2). In other embodiments, the gate electrode structure 110 may be or comprise a metal, such as aluminum (Al), copper (Cu), titanium (Ti), tantalum (Ta), tungsten (W), molybdenum (Mo), cobalt (Co), or the like. In such embodiments, the first gate dielectric structure 112 and/or the second gate dielectric structure 116 may be or comprise a high-k dielectric material, such as hafnium oxide (HfO), tantalum oxide (TaO), hafnium silicon oxide (HfSiO), hafnium tantalum oxide (HfTaO), aluminum oxide (AlO), zirconium oxide (ZrO), or the like.

The gate electrode structure 110 at least partially overlies the first gate dielectric structure 112. The gate electrode structure 110 at least partially overlies the second gate dielectric structure 116. The gate electrode structure 110 overlies both a portion 120 of the first gate dielectric structure 112 and a portion 122 of the second gate dielectric structure 116. In some embodiments, the portion of the gate electrode structure 110 that overlies the portion 120 of the first gate dielectric structure 112 has a first height (e.g., a vertical distance between an upper and lower surface). In further embodiments, the portion of the gate electrode structure 110 that overlies the portion 122 of the second gate dielectric structure 112 has a second height that is less than the first height. In yet further embodiments, the portion of the gate electrode structure 110 that overlies the portion 120 of the first gate dielectric structure 112 is referred to as a first portion of the gate electrode structure 110; and the portion of the gate electrode structure 110 that overlies the portion 122 of the second gate dielectric structure 116 is referred to as a second portion of the gate electrode structure 110.

The gate electrode structure 110, the portion of the first gate dielectric structure 112 that the gate electrode structure 110 overlies, and the portion of the second gate dielectric structure 116 that the gate electrode structure 110 overlies define a transfer gate 124. For example, the gate electrode structure 110, the portion 120 of the first gate dielectric structure 112, and the portion 122 of the second gate dielectric structure 116 define the transfer gate 124. The transfer gate 124 is disposed on the front side 102f of the substrate 102. The transfer gate 124 is configured to selectively form a conductive channel between the photodetector 104 and the floating diffusion node 106, such that charges accumulated in the photodetector 104 (e.g., via absorbing the incident radiation) may be transferred to the floating diffusion node 106.

An interlayer dielectric (ILD) structure 126 is disposed over the front side 102f of the substrate 102. The ILD structure 126 is disposed over the first gate dielectric structure 112, the second gate dielectric structure 116, and the gate electrode structure 110 (and thus the transfer gate 124). In some embodiments, the ILD structure 126 comprises one or more stacked ILD layers, which may respectively comprise a low-k dielectric (e.g., a dielectric material with a dielectric constant less than about 3.9), an oxide (e.g., $SiO_2$), or the like. In some embodiments, the ILD structure 126 is referred to as a dielectric structure.

An interconnect structure 128 (e.g., copper interconnect) is disposed in the ILD structure 126 and over the front side 102f of the substrate 102. The interconnect structure 128 comprises a plurality of conductive contacts 128a (e.g., metal contacts), a plurality of conductive vias 128b (e.g., metal vias), and a plurality of conductive wires 128c (e.g., metal wires). In some embodiments, the interconnect structure 128 may be or comprise, for example, copper (Cu), aluminum (Al), tungsten (W), gold (Au), some other conductive material, or a combination of the foregoing. In further embodiments, the plurality of conductive contacts 128a may comprise a first conductive material (e.g., W), and the plurality of conductive vias 128b and the plurality of conductive wires 128c may comprise a second conductive material (e.g., Cu) different than the first conductive material.

The plurality of conductive contacts 128a comprise a first conductive contact $128a_1$ and a second conductive contact $128a_2$. The first conductive contact $128a_1$ extends vertically from the gate electrode structure 110 to a first one of the plurality of conductive wires 128c. The first conductive contact $128a_1$ electrically couples the gate electrode structure 110 to the first one of the plurality of conductive wires 128c. The first conductive contact $128a_1$ overlies the second gate dielectric structure 116. In some embodiments, the first conductive contact $128a_1$ overlies the portion 122 of the second gate dielectric structure 116.

The second conductive contact $128a_2$ extends vertically from the floating diffusion node 106 to a second one of the plurality of conductive wires 128c. The second conductive contact $128a_2$ electrically couples the floating diffusion node 106 to the second one of the plurality of conductive wires 128c.

A deep trench isolation (DTI) structure 130 is disposed in the substrate 102. The DTI structure 130 extends into the substrate 102 from the back side 102b of the substrate 102. In some embodiments, the DTI structure 130 extends from the back side 102b (e.g., the back side surface) of the substrate 102 vertically through the substrate 102 to at least the front side 102f (e.g., the front side surface) of the substrate 102 (e.g., the DTI structure 130 extends completely through the substrate 102). In some embodiments, the DTI structure 130 contacts (e.g., directly contact) the second gate dielectric structure 116. In further embodiments, the DTI structure 130 may extend vertically through the substrate 102 (e.g., from the back side 102b of the substrate 102 and through the front side 102f of the substrate 102) to contact the second gate dielectric structure 116. In some embodiments, the DTI structure 130 is referred to as an isolation structure. In other embodiments, the DTI structure 130 may be referred to as back-side deep trench isolation (BDTI) structure.

Because the second gate dielectric structure 116 has the second thickness 118, the second gate dielectric structure 116 may be utilized as a safe landing area for the process for forming the DTI structure 130, which is described in more detail hereinafter. Therefore, in comparison to a typical image sensor (e.g., an image sensor having a transfer gate with a gate dielectric that is the same thickness throughout), a size of the gate electrode structure 110 may be increased and/or the gate electrode structure 110 may be disposed nearer (in a lateral direction) to the DTI structure 130. Thus, in comparison to a typical image sensor, the first conductive contact 128a$_1$ may also be disposed nearer the DTI structure 130. Further, because the gate electrode structure 110 overlies both the portion 120 of the first gate dielectric structure 112 and the portion 122 of the second gate dielectric structure 116, charges accumulated in the photodetector 104 may be efficiently transferred from the photodetector 104 to the floating diffusion node 106 (e.g., if the transfer gate 124 has a gate dielectric that is too thick near the floating diffusion node 106, the ability of the transfer gate 124 to control the transfer of charges from the photodetector 104 to the floating diffusion node 106 may be negatively affected). Accordingly, dimensions of the image sensor may be smaller than (e.g., scaled down more than) a typical image sensor (e.g., the image sensor may improve the ability to scale down the dimensions of images sensors due to the gate electrode structure 110 overlying both the portion 120 of the first gate dielectric structure 112 and the portion 122 of the second gate dielectric structure 116).

Also shown in the various views 100a-100b of FIGS. 1A-1B, the DTI structure 130 extends laterally through the substrate 102. In some embodiments, the DTI structure 130 extends laterally through the substrate 102 in a closed loop path. In some embodiments, the DTI structure 130 may laterally surround the photodetector 104. In further embodiments, the DTI structure 130 laterally surrounds the floating diffusion node 106 (and the doped well 108). A pixel region 132 of the substrate 102 is disposed within a first perimeter 134 (e.g., inner perimeter) of the DTI structure 130. The first perimeter 134 of the DTI structure 130 is defined by sidewalls (e.g., inner sidewalls) of the DTI structure 130.

In some embodiments, the pixel region 132, the features (e.g., structural features) disposed inside the pixel region 132 (e.g., the photodetector 104, the floating diffusion node 106, and the doped well 108), and the transfer gate 124 are part of a pixel 133 of the image sensor. For example, the pixel 133 comprises the pixel region 132, the photodetector 104, the floating diffusion node 106 (and the doped well 108), and the transfer gate 124 (which comprises the gate electrode structure 110, the portion 120 of the first gate dielectric structure 112, and the portion 122 of the second gate dielectric structure 116).

The gate electrode structure 110 partially overlies the pixel region 132 of the substrate 102. In some embodiments, the gate electrode structure 110 is disposed laterally within (e.g., completely laterally within) the first perimeter 134 of the DTI structure 130. The first gate dielectric structure 112 partially overlies the pixel region 132 of the substrate 102. In some embodiments, the first gate dielectric structure 112 is disposed laterally within (e.g., completely laterally within) the first perimeter 134 of the DTI structure 130. The second gate dielectric structure 116 partially overlies the pixel region 132 of the substrate 102. The second gate dielectric structure 116 overlies, at least partially, the DTI structure 130. In some embodiments, the second gate dielectric structure 116 overlies (e.g., completely overlies) the DTI structure 130. In some embodiments, the first conductive contact 128a$_1$ is disposed laterally within the first perimeter 134 of the DTI structure 130.

The first dielectric structure 112 has a perimeter 136 (e.g., outer perimeter). The perimeter 136 of the first gate dielectric structure 112 is defined by sidewalls (e.g., outer sidewalls) of the first gate dielectric structure 112. In some embodiments, the perimeter 136 of the first gate dielectric structure 112 is disposed laterally within the first perimeter 134 of the DTI structure 130.

In some embodiments, the second gate dielectric structure 116 has a sidewall 138 disposed laterally between a first sidewall 140 of the gate electrode structure 110 and a second sidewall 142 of the gate electrode structure 110. In some embodiments, the sidewall 138 of the second gate dielectric structure 116 adjoins (e.g., directly contacts) a sidewall of the first gate dielectric structure 112 laterally between the first sidewall 140 of the gate electrode structure 110 and the second sidewall 142 of the gate electrode structure 110. In some embodiments, the sidewall 138 of the second gate dielectric structure 116 faces the first gate dielectric structure 112. The first sidewall 140 of the gate electrode structure 110 is opposite the second sidewall 142 of the gate electrode structure 110. The first sidewall 140 of the gate electrode structure 110 faces a first sidewall 144 of the DTI structure 130. In some embodiments, the first conductive contact 128a$_1$ is disposed laterally between the second sidewall 142 of the gate electrode structure 110 and the first sidewall 144 of the DTI structure 130. In some embodiments, the first sidewall 140 of the gate electrode structure 110 has a first length; and the second sidewall 142 of the gate electrode structure 110 has a second length that is greater than the first length.

In some embodiments, the floating diffusion node 106 (and the doped well 108) is disposed in the pixel region 132 of the substrate 102. The floating diffusion node 106 (and the doped well 108) is disposed on a side of the DTI structure 130 (e.g., a side of the first sidewall 144 of the DTI structure 130). The photodetector 104 is disposed laterally between the floating diffusion node 106 and the DTI structure 130 (e.g., the first sidewall 144 of the DTI structure 130).

In some embodiments, the floating diffusion node 106 (and the doped well 108) is disposed laterally within the perimeter 136 of the first gate dielectric structure 112. In some embodiments, the second conductive contact 128a$_2$ is disposed laterally within the first perimeter 134 of the DTI structure 130. In further embodiments, the second conductive contact 128a$_2$ is disposed laterally within the perimeter 136 of the first gate dielectric structure 112.

In some embodiments, the first thickness 114 is less than or equal to about 70 angstroms (Å) (e.g., about 70 Å includes small variations due to fabrication processes). In further embodiments, the first thickness 114 is between about 60 Å and about 70 Å. In some embodiments, if the first thickness 114 is greater than about 70 Å, the transfer gate 124 may not be able to control the flow of charges between the photodetector 104 and the floating diffusion node 106.

In some embodiments, the second thickness 118 is between about 80 Å and about 3000 Å. In some embodiments, the second thickness 118 is about 150 Å. In some embodiments, if the second thickness 118 is greater than about 3000 Å, the transfer gate 124 may not be able to control the flow of charges between the photodetector 104 and the floating diffusion node 106 (e.g., due to an effective height reduction of the gate electrode structure 110). In further embodiments, if the second thickness 118 is less than about 80 Å, the second dielectric structure 122 may not be able to be utilized as a safe landing area (e.g., due to the etching process for forming the DTI structure 130 being able to easily etch completely through the second gate dielectric structure 116).

Figures 2A, 2B:
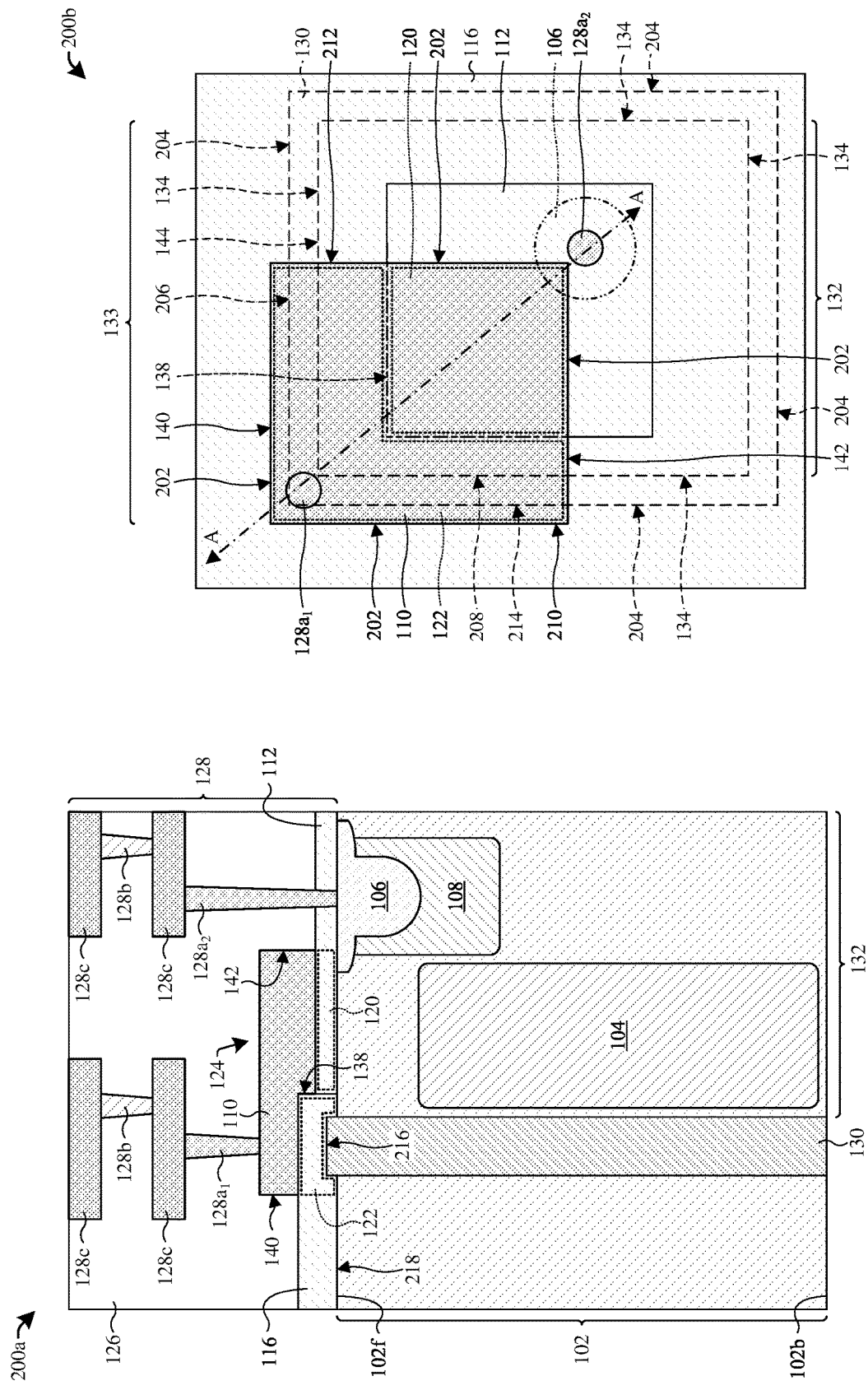
FIGS. 2A-2B illustrate various views of some other embodiments of the image sensor of FIGS. 1A-1B.

FIGS. 2A-2B illustrate various views 200a-200b of some other embodiments of the image sensor of FIGS. 1A-1B. More specifically, FIG. 2A illustrates a cross-sectional view 200a of some other embodiments of the image sensor of FIGS. 1A-1B. FIG. 2B illustrates a layout view 200b of the image sensor illustrated in FIG. 2A. The cross-sectional view 200a of FIG. 2A is taken along line A-A of FIG. 2B.

As shown in the various views 200a-200b of FIGS. 2A-2B, in some embodiments, the gate electrode structure 110 overlies the DTI structure 130. In further embodiments, the first perimeter 134 of the DTI structure 130 is disposed partially within a perimeter 202 (e.g., outer perimeter) of the gate electrode structure 110. The perimeter 202 of the gate electrode structure 110 is defined by sidewalls (e.g., outer sidewalls) of the gate electrode structure 110. In yet further embodiments, a second perimeter 204 of the DTI structure 130 is disposed partially within the perimeter 202 of the gate electrode structure 110. The second perimeter 204 of the DTI structure 130 is defined by sidewalls (e.g., outer sidewalls) of the DTI structure 130.

In some embodiments, the first sidewall 144 of the DTI structure 130 is disposed laterally between the first sidewall 140 of the gate electrode structure 110 and the second sidewall 142 of the gate electrode structure 110. In further embodiments, a second sidewall 206 of the DTI structure 130 is disposed laterally between the first sidewall 140 of the gate electrode structure 110 and the second sidewall 142 of the gate electrode structure 110. In some embodiments, a third sidewall 208 of the DTI structure 130 is disposed laterally between a third sidewall 210 of the gate electrode structure 110 and a fourth sidewall 212 of the gate electrode structure 110. The third sidewall 210 of the gate electrode structure 110 is opposite the fourth sidewall 212 of the gate electrode structure 110. In further embodiments, a fourth sidewall 214 of the DTI structure 130 is disposed laterally between the third sidewall 210 of the gate electrode structure 110 and the fourth sidewall 212 of the gate electrode structure 110. In some embodiments, DTI structure 130 is disposed laterally between the sidewall 138 of the second gate dielectric structure 116 and the first sidewall 140 of the gate electrode structure 110.

Also shown in the various views 200a-200b of FIGS. 2A-2B, in some embodiments, the first conductive contact 128$a_1$ overlies the DTI structure 130. In such embodiments, the first conductive contact 128$a_1$ is disposed laterally, at least partially, between the first perimeter 134 of the DTI structure 130 and the second perimeter 204 of the DTI structure 130. In further embodiments, the first perimeter 134 of the DTI structure 130 and/or the second perimeter 204 of the DTI structure 130 may be disposed partially within a perimeter of the first conductive contact 128$a_1$. Because the first conductive contact 128a overlies the DTI structure 130, the dimensions of the image sensor may be even more scaled down than in comparison to a typical image sensor.

Also shown in the various views 200a-200b of FIGS. 2A-2B, in some embodiments, the front side 102f (e.g., the front side surface) of the substrate 102 is disposed vertically between a surface 216 (e.g., upper surface) of the DTI structure 130 and the back side 102b (e.g., the back side surface) of the substrate 102. In such embodiments, a surface 218 of the second gate dielectric structure 116 is disposed vertically between the surface 216 of the DTI structure 130 and the front side 102f (e.g., the front side surface) of the substrate 102. In further such embodiments, the surface 218 of the second gate dielectric structure 116 may adjoin (e.g., directly contact) the front side 102f of the substrate 102.

Figure 3:
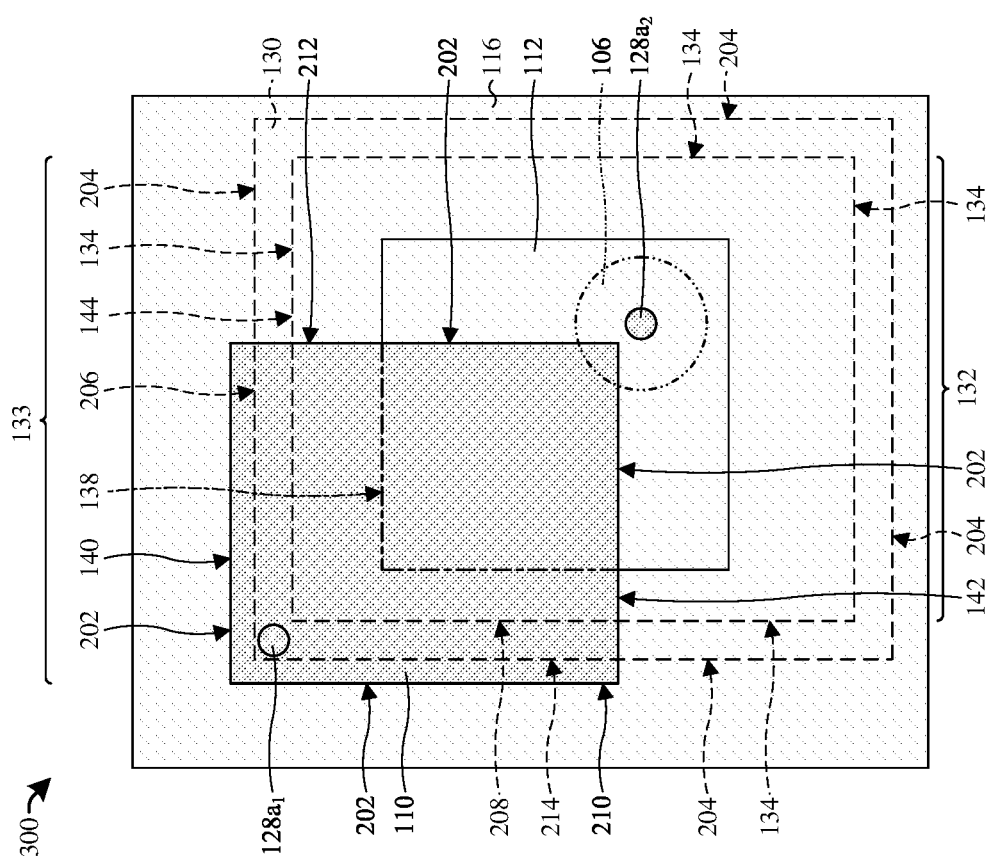
FIG. 3 illustrates a layout view of some other embodiments of the image sensor of FIGS. 2A-2B.

FIG. 3 illustrates a layout view 300 of some other embodiments of the image sensor of FIGS. 2A-2B.

As shown in the layout view 300 of FIG. 3, in some embodiments, the first conductive contact 128$a_1$ is disposed within (e.g., completely within) the second perimeter 204 of the DTI structure 130. In some embodiments, the first conductive contact 128$a_1$ is disposed laterally between the second perimeter 204 of the DTI structure 130 and the first perimeter 134 of the DTI structure. In some embodiments, the first conductive contact 128$a_1$ is disposed outside (e.g., completely outside) the first perimeter 134 of the DTI structure 130.

Figure 4:
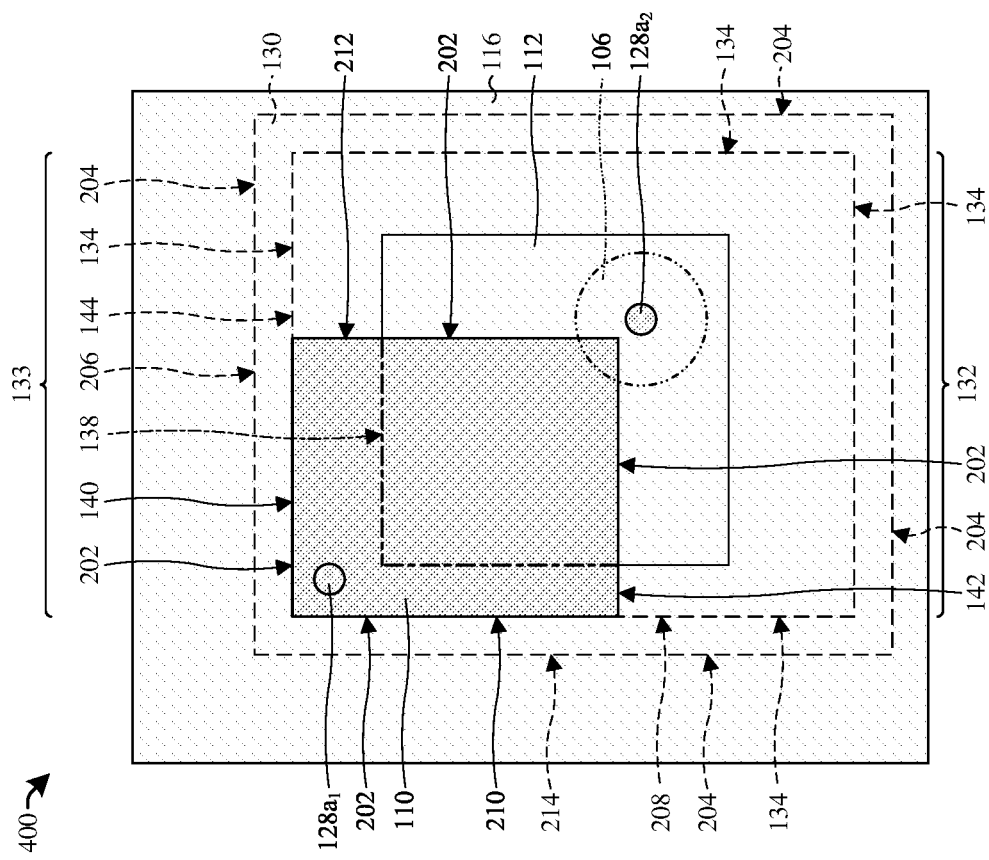
FIG. 4 illustrates a layout view of some other embodiments of the image sensor of FIGS. 2A-2B.

FIG. 4 illustrates a layout view 400 of some other embodiments of the image sensor of FIGS. 2A-2B.

As shown in the layout view 400 of FIG. 4, in some embodiments, one or more sidewalls of the gate electrode structure 110 may be substantially aligned (e.g., substantially aligned includes small variations due to fabrication processes) with one or more sidewalls of the DTI structure 130. For example, in some embodiments, the first sidewall 140 of the gate electrode structure 110 is substantially aligned with the first sidewall 144 of the DTI structure 130. In some embodiments, the third sidewall 210 of the gate electrode structure 110 is substantially aligned with the third sidewall 208 of the DTI structure 130. In such embodiments, the first conductive contact 128$a_1$ may be disposed laterally within the first perimeter 134 of the DTI structure 130.

Figure 5:
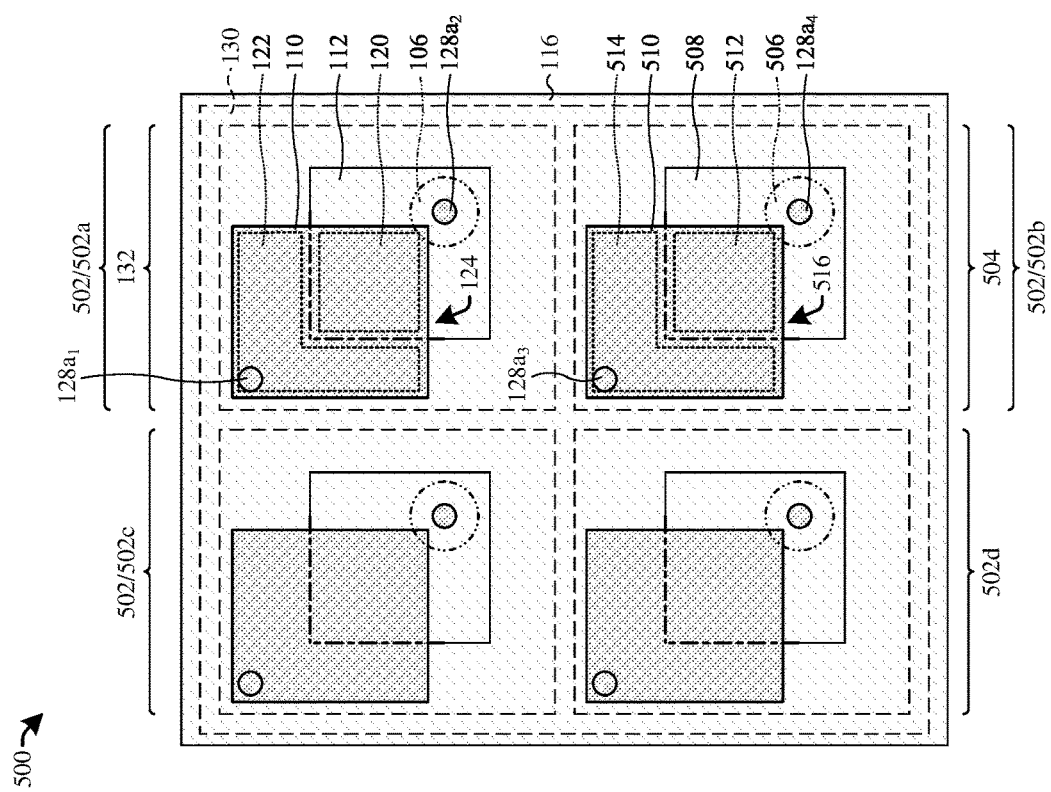
FIG. 5 illustrates a layout view of some other embodiments of the image sensor of FIG. 3.

FIG. 5 illustrates a layout view 500 of some other embodiments of the image sensor of FIG. 3.

As shown in the layout view 500 of FIG. 5, the image sensor comprises a plurality of pixels 502. For example, the image sensor comprises a first pixel 502a, a second pixel 502b, a third pixel 502c, and a fourth pixel 502d. The plurality of pixels 502 are disposed in an array comprising rows and columns. In some embodiments, each of the pixels of the plurality of pixels 502 comprises substantially similar features (e.g., structural features/components) as the pixel 133 described herein. In further embodiments, each of the pixels of the plurality of pixels 502 have substantially similar layouts.

For example, as shown in the layout view 500 of FIG. 5, the first pixel 502a comprises the transfer gate 124 (which comprises the gate electrode structure 110, the portion 120 of the first gate dielectric structure 112, and the portion 122 of the second gate dielectric structure 116), the first gate dielectric structure 112, the floating diffusion node 106, and the pixel region 132. Although not shown in FIG. 5, it will be appreciated that the first pixel 502a comprises the photodetector 104 (and the doped well 108) and any other features that may be disposed in the pixel region 132 (see, e.g., FIGS. 1A-1B). The first conductive contact $128a_1$ extends vertically from the gate electrode structure 110 (to a first one of the plurality of conductive wires 128c (see, e.g., FIGS. 1A-1B)). The second conductive contact $128a_2$ extends vertically from the floating diffusion node 106 (to a second one of the plurality of conductive wires 128c (see, e.g., FIGS. 1A-1B)).

The second pixel 502b, the third pixel 502c, and the fourth pixel 502d comprise substantially similar features as the first pixel 502a. Further, the first pixel 502a, the second pixel 502b, the third pixel 502c, and the fourth pixel 502d have substantially similar layouts. For example, the second pixel 502b comprises a pixel region 504 disposed in the substrate 102 (not shown) that is substantially similar to the pixel region 132. A photodetector (not shown) and a floating diffusion node 506 (and a doped well (not shown)) is disposed in the pixel region 504. The photodetector disposed in the pixel region 504 is substantially the same as the photodetector 104. The floating diffusion node 506 (and the doped well) disposed in the pixel region 504 is substantially the same as the floating diffusion node 106 (and the doped well 108).

The second gate dielectric structure 116 partially overlies the pixel region 504. A third gate dielectric structure 508 partially overlies the pixel region 504. The third gate dielectric structure 508 is substantially the same as the first gate dielectric structure 112. A gate electrode structure 510 at least partially overlies the third gate dielectric structure 508. The gate electrode structure 510 at least partially overlies the second gate dielectric structure 116. The gate electrode structure 510 overlies both a portion 512 of the third gate dielectric structure 508 and a portion 514 of the second gate dielectric structure 116. The gate electrode structure 510 is substantially the same as the gate electrode structure 110.

The gate electrode structure 510, the portion 512 of the third gate dielectric structure 508, and the portion 514 of the second gate dielectric structure 116 define a transfer gate 516. The transfer gate 516 is substantially the same as the transfer gate 124. A third conductive contact $128a_3$ of the plurality of conductive contacts 128a (see, FIGS. 1A-1B) extends vertically from the gate electrode structure 510 to a third one of the plurality of conductive wires 128c (see, FIGS. 1A-1B). The third conductive contact $128a_3$ electrically couples the gate electrode structure 510 to the third one of the plurality of conductive wires 128c. The third conductive contact $128a_3$ is substantially the same as the first conductive contact $128a_1$. A fourth conductive contact 128a4 of the plurality of conductive contacts 128a (see, FIGS. 1A-1B) extends vertically from the floating diffusion node 506 to a fourth one of the plurality of conductive wires 128c (see, FIGS. 1A-1B). The fourth conductive contact 128a4 electrically couples the floating diffusion node 506 to the fourth one of the plurality of conductive wires 128c. The fourth conductive contact 128a4 is substantially the same as the second conductive contact $128a_2$.

The DTI structure 130 extends laterally through the substrate 102 and laterally surrounds each of the pixel regions of the plurality of pixels 502. For example, the DTI structure 130 extends laterally through the substrate 102 and laterally surrounds the pixel region 132, the pixel region 504, and so forth, as illustrated in the layout view 500 of FIG. 5. The second gate dielectric structure 116 extends laterally over the substrate 102 and laterally surrounds the other gate dielectric structures of the plurality of pixels 502. For example, the second gate dielectric structure 116 extends laterally over the substrate 102 and laterally surrounds the first gate dielectric structure 112, the third gate dielectric structure 508, and so forth, as illustrated in the layout view 500 of FIG. 5. While FIG. 5 illustrates four (4) pixels, it will be appreciated that the image sensor of FIG. 5 may comprise any number of pixels (e.g., 1, 2, 4, 8, 16, 32, 64, etc.).

Figure 6:
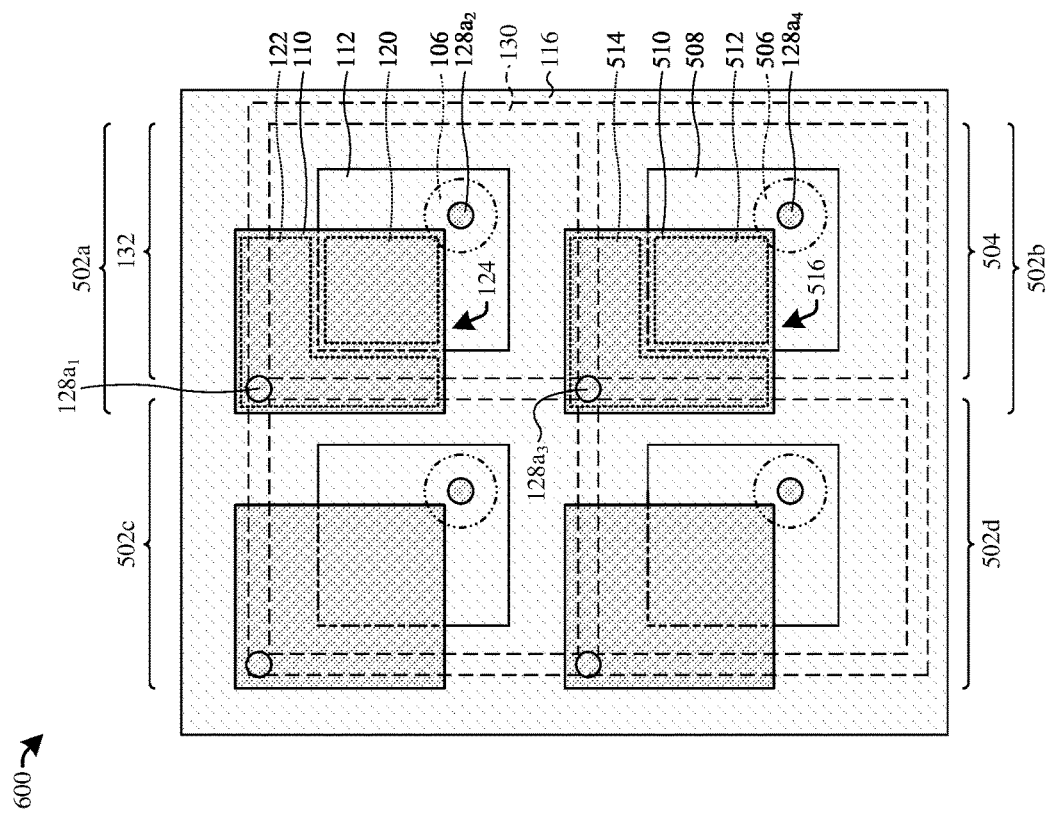
FIG. 6 illustrates a layout view of some other embodiments of the image sensor of FIG. 5.

FIG. 6 illustrates a layout view 600 of some other embodiments of the image sensor of FIG. 5.

As shown in the layout view 600 of FIG. 6, in some embodiments, the transfer gates of the pixels 502 overlie the DTI structure 130. For example, the transfer gate 124 overlies the DTI structure 130, the transfer gate 516 overlies the DTI structure 130, and so forth, as illustrated in the layout view 600 of FIG. 6. In further embodiments, the conductive contacts of the plurality of conductive contacts 128a that extend vertically from the gate electrodes of the plurality of pixels 502 overlie the DTI structure 130. For example, the first conductive contact $128a_1$ overlies the DTI structure 130, the third conductive contact $128a_3$ overlies the DTI structure 130, and so forth, as illustrated in the layout view 600 of FIG. 6. While FIG. 6 illustrates four (4) pixels, it will be appreciated that the image sensor of FIG. 6 may comprise any number of pixels (e.g., 1, 2, 4, 8, 16, 32, 64, etc.).

Figure 7:
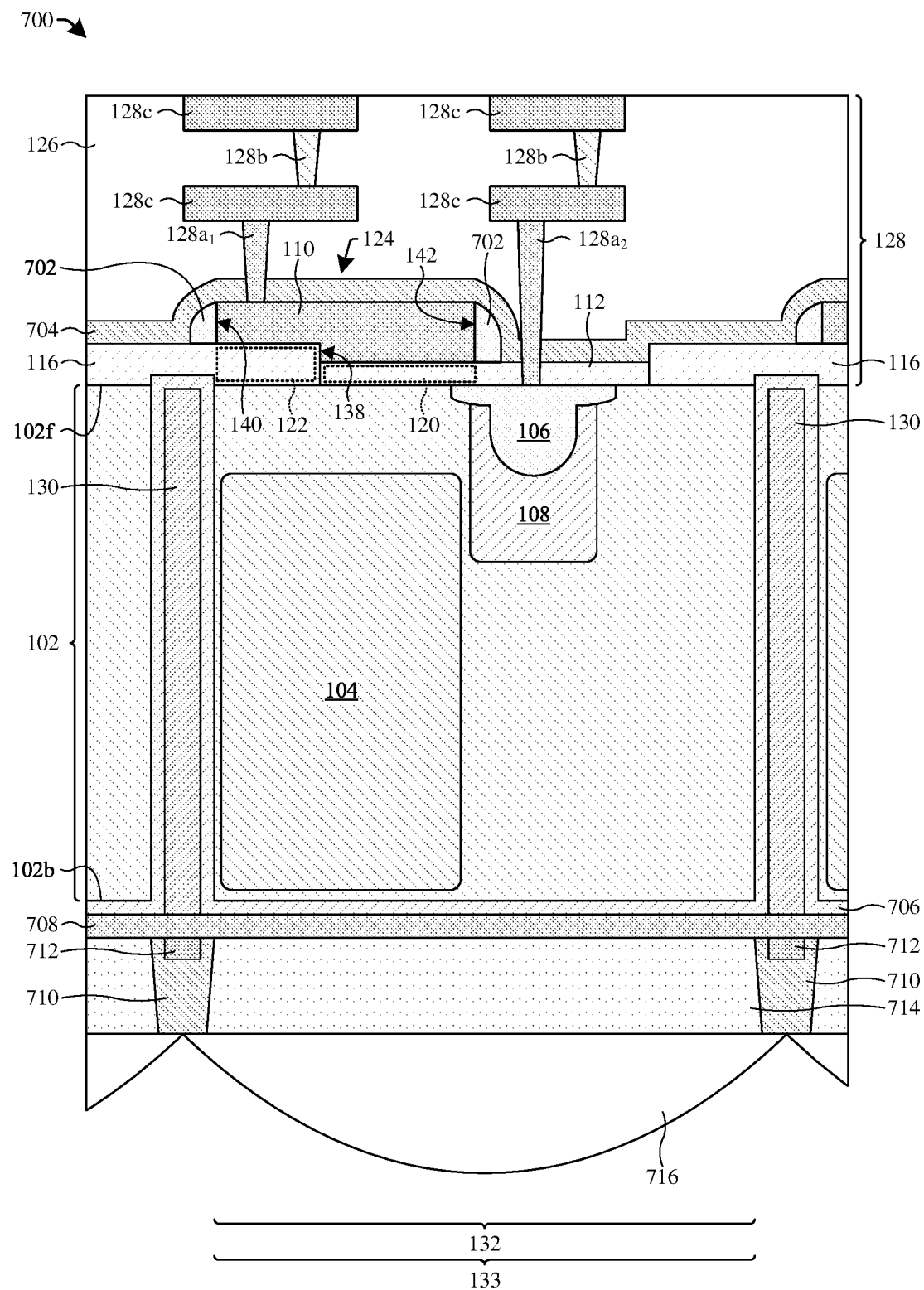
FIG. 7 illustrates a cross-sectional view of some other embodiments of the image sensor of FIGS. 1A-1B.

FIG. 7 illustrates a cross-sectional view 700 of some other embodiments of the image sensor of FIGS. 1A-1B.

As shown in the cross-sectional view 700 of FIG. 7, the image sensor may comprises a sidewall spacer 702 disposed over the substrate 102 and along sidewalls of the gate electrode structure 110. In some embodiments, the sidewall spacer 702 is disposed over both the first gate dielectric structure 112 and the second gate dielectric structure 116. The sidewall spacer 702 may extend laterally around the gate electrode structure 110 in a closed loop path.

The sidewall spacer 702 has a first height over the first gate dielectric structure 112 and a second height, which is less than the first height, over the second gate dielectric structure 116. For example, the sidewall spacer 702 has a first portion that overlies the first gate dielectric structure 112 and a second portion that overlies the second gate dielectric structure 116. The first portion of the sidewall spacer 702 has a first height, and the second portion of the sidewall spacer has a second height that is less than the first height, as shown in the cross-sectional view 700 of FIG. 7. In some embodiments, the sidewall spacer 702 may be or comprise, for example, for example, an oxide (e.g., $SiO_2$), a nitride (e.g., SiN), an oxy-nitride (e.g., $SiO_xN_y$), some other dielectric, or a combination of the foregoing (e.g., ONO sidewall spacer).

A contact etch stop layer (CESL) 704 may be disposed over the substrate 102, the first gate dielectric structure 112, the second gate dielectric structure 116, the gate electrode structure 110, and the sidewall spacer 702. In some embodiments, the CESL 704 lines the first gate dielectric structure 112, the second gate dielectric structure 116, the gate electrode structure 110, and the sidewall spacer 702. The plurality of conductive contacts 128a penetrate the CESL 704. For example, the first conductive contact $128a_1$ penetrates the CESL 704 to contact the gate electrode structure 110, and the second conductive contact $128a_2$ penetrates the CESL 704 to contact the floating diffusion node 106. The CESL 704 may be or comprise, for example, an oxide (e.g., SiO2), a nitride (e.g., SiN), an oxy-nitride (e.g., SiON), some other dielectric material, or a combination of the foregoing.

In some embodiments, a dielectric layer 706 lines the back side 102b (e.g., back side surface) of the substrate and the DTI structure 130. The dielectric layer 706 extends into the substrate 102 from the back side 102b and along sidewalls of the DTI structure 130. In some embodiments, the dielectric layer 706 is referred to as a dielectric liner layer.

In some embodiments, the dielectric layer 706 penetrates the front side 102f (e.g., front side surface) of the substrate 102 and partially penetrates the second gate dielectric structure 116, as shown in the cross-sectional view 700 of FIG. 7. In some embodiments, the dielectric layer 706 also lines upper surfaces of the DTI structure 130, such that the dielectric layer 706 is disposed vertically between (e.g., directly vertically between) the DTI structure 130 and the second gate dielectric structure 116. In some embodiments, the dielectric layer 706 may be or comprise, for example, an oxide (e.g., SiO$_2$), a nitride (e.g., SiN), an oxy-nitride (e.g., SiON), a carbide (e.g., silicon carbide (SiC)), a high-k dielectric (e.g., HfO, TaO, etc.), some other dielectric material, or a combination of the foregoing. In some embodiments, the DTI structure 130 may be or comprise, for example, an oxide (e.g., SiO$_2$), a nitride (e.g., SiN), an oxy-nitride (e.g., SiON), tetraethoxysilane (TEOS), some other dielectric material, or a combination of the foregoing. In some embodiments, the DTI structure 130 has a first chemical composition (e.g., TEOS), and the dielectric layer 706 has a second chemical composition different than the first chemical composition (e.g., high-k dielectric). In embodiments in which the image sensor comprises the dielectric layer 706 and the DTI structure 130, the DTI structure 130 and the portions of the dielectric layer 706 that lines surfaces of the DTI structure (e.g., sidewalls, upper surfaces, etc.) may be collectively referred to as a DTI structure (e.g., BDTI structure).

In some embodiments, a light transmission structure 708 is disposed along the dielectric layer 706 and the DTI structure 130. In some embodiments, the dielectric layer 706 vertically separates the light transmission structure 708 from the back side 102b of the substrate 102. In some embodiments, the light transmission structure 708 is an anti-reflective layer (e.g., anti-reflective coating (ARC)). In some embodiments, the light transmission structure 708 is or comprises, for example, an oxide (e.g., SiO2), a nitride (e.g., SiN), a carbide (e.g., SiC), a high-k dielectric (e.g., HfO, TaO, etc.), or the like.

In some embodiments, a dielectric grid 710 is disposed along the light transmission structure 708. The light transmission structure 708 may vertically separate the dielectric grid 710 from the back side 102b of the substrate 102. The dielectric grid 710 may be or comprise, for example, an oxide (e.g., SiO2), a nitride (e.g., SiN), a carbide (e.g., SiC), a high-k dielectric (e.g., HfO. TaO, etc.), a low-k dielectric, some other dielectric, or a combination of the foregoing.

In some embodiments, a metal grid 712 is embedded in the dielectric grid 710. The metal grid 712 is configured to reflect incident radiation away from the back side 102b of the substrate 102. The light transmission structure 708 may vertically separate the metal grid 712 from the back side 102b of the substrate 102. In some embodiments, the metal grid 712 is or comprises, for example, aluminum (Al), cobalt (Co), copper (Cu), silver (Ag), gold (Au), tungsten (W), some other metal, or a combination of the foregoing.

In some embodiments, an electromagnetic radiation (EMR) filter 714 (e.g., infrared filter, color filter, etc.) is disposed along the light transmission structure 708 and within the dielectric grid 710. The light transmission structure 708 may vertically separate the EMR filter 714 from the back side 102b of the substrate 102. The EMR filter 714 is configured to transmit specific wavelengths (or specific ranges of wavelengths) of the incident radiation. It will be appreciated that the EMR filter 714 may be one EMR filter of a plurality of EMR filters disposed within the dielectric grid 710.

In some embodiments, a micro-lens 716 is disposed along the EMR filter 714. In some embodiments, the EMR filter 714 vertically separates the micro-lens 716 from the back side 102b of the substrate 102. In some embodiments, the micro-lens 716 is substantially centered over the pixel region 132. The micro-lens 716 is configured to focus incident radiation towards the photodetector 104. It will be appreciated that the micro-lens 716 may be one micro-lens of a plurality of micro-lenses disposed along the plurality of EMR filters.

Figure 8:
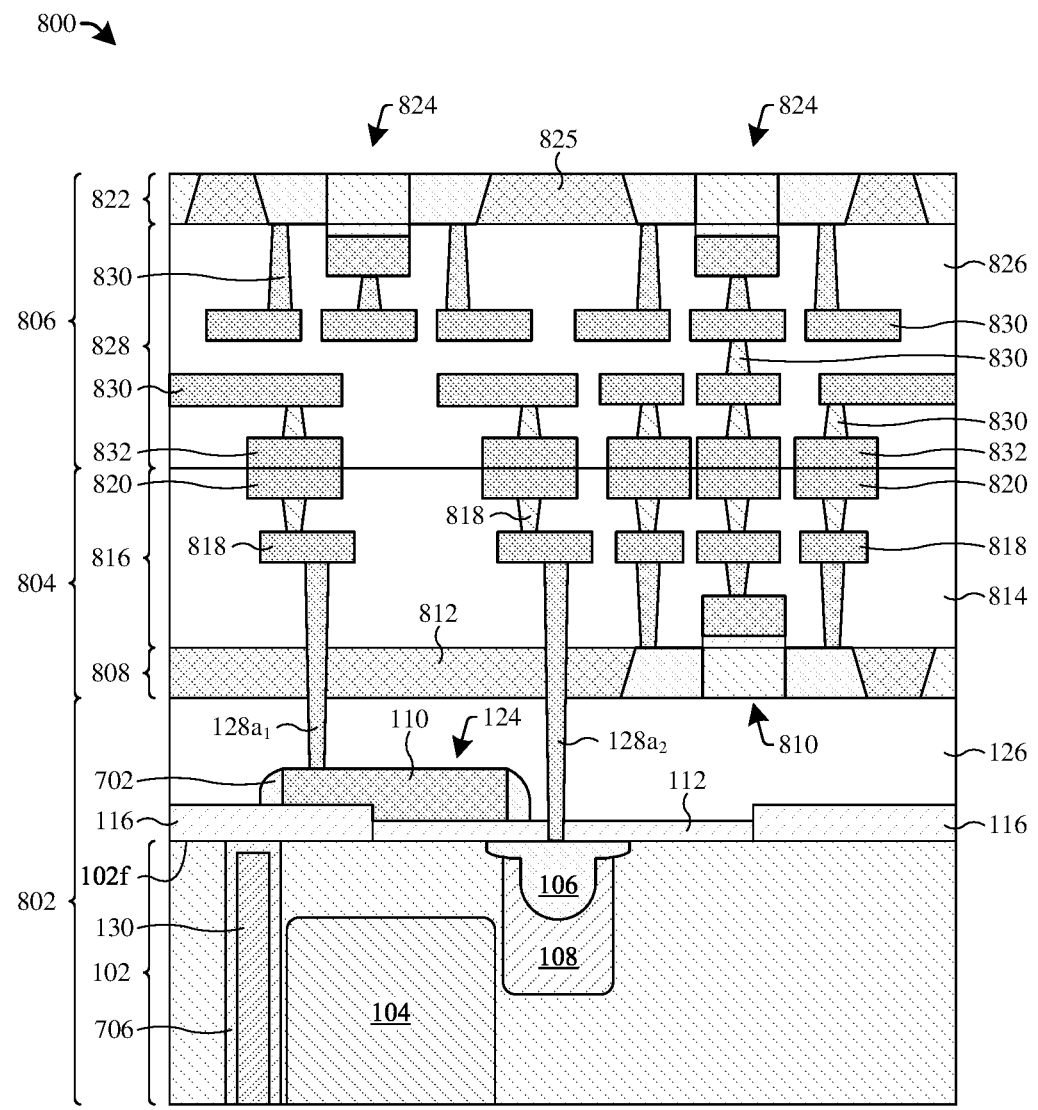
FIG. 8 illustrates a cross-sectional view of some other embodiments of the image sensor of FIG. 7.

FIG. 8 illustrates a cross-sectional view 800 of some other embodiments of the image sensor of FIG. 7.

As shown in the cross-sectional view 800 of FIG. 8, in some embodiments, the IC comprises a first chip 802, a second chip 804, and a third chip 806. The first chip 802, the second chip 804, and the third chip 806 are bonded together. The first chip 802, the second chip 804, and the third chip 806 are vertically stacked and electrically coupled together. In such embodiments, the image sensor may be referred to as a three (3) chip image sensor (e.g., 3-chip CIS).

The first chip 802 comprises the substrate 102, the photodetector 104, the floating diffusion node 106, the doped well 108, the first gate dielectric structure 112, the second gate dielectric structure 116, the gate electrode structure 110, the transfer gate 124, the sidewall spacer 702, the ILD structure 126, the first conductive contact $128a_1$, and the second conductive contact $128a_2$. While not shown in FIG. 8, it will be appreciated that the first chip 802 may comprise any of the features (e.g., structural features) of the image sensors illustrated in FIGS. 1-7.

The second chip 804 comprises a substrate 808 (e.g., semiconductor substrate). One or more readout transistors 810 (e.g., reset transistor, source follower transistor, row-select transistor, anti-bloom transistor, etc.) are disposed on/in the substrate 808. In some embodiments, an isolation structure 812 (e.g., shallow trench isolation (STI) structure) is disposed in the substrate 808 and laterally surrounds the one or more readout transistors 810.

An ILD structure 814 is disposed over the substrate 808 and the one or more readout transistors 810. An interconnect structure 816 (e.g., copper interconnect structure) is embedded in the ILD structure 814. The interconnect structure 816 electrically couples the one or more readout transistors 810 together in a predefined manner. The interconnect structure 816 comprises a plurality of conductive features 818 (e.g., metal lines, vias, and/or contacts) and a plurality of conductive bond pads 820. In some embodiments, the first conductive contact $128a_1$ and the second conductive contact $128a_2$ extend vertically from the first chip 802 to corresponding conductive features of the plurality of conductive features 818, thereby electrically coupling the first chip 802 to the second chip 804.

The third chip 806 comprises a substrate 822 (e.g., (e.g., semiconductor substrate). One or more logic transistors 824 are disposed on/in the substrate 822. In some embodiments, an isolation structure 825 (e.g., STI structure) is disposed in the substrate 822 and laterally surrounds the one or more logic transistors 824.

An ILD structure 826 is disposed vertically between the substrate 822 and the ILD structure 814. An interconnect structure 828 (e.g., copper interconnect structure) is embedded in the ILD structure 826. The interconnect structure 828 electrically couples the one or more logic transistors 824 together in a predefined manner. The interconnect structure 828 comprises a plurality of conductive features 830 (e.g., metal lines, vias, and/or contacts) and a plurality of conductive bond pads 832. The conductive bond pads 832 are electrically coupled to the conductive bond pads 820, thereby electrically coupling the second chip 804 to the third chip 806.

In some embodiments, the first chip 802 comprises only transfer gates (e.g., transfer gate 124), but not any of the one or more readout transistors 810 or any of the one or more logic transistors 824. In such embodiments, the second chip 804 may comprise only the one or more readout transistors 810, but not any of the one or more logic transistors 824 or any of the transfer gates. In further such embodiments, the third chip 806 may comprise only the one or more logic transistors 824, but not any of the one or more readout transistors 810 or any of the transfer gates.

In other embodiments, the first chip 802 comprises only transfer gates (e.g., transfer gate 124), but not any of the one or more readout transistors 810 or any of the one or more logic transistors 824. In such embodiments, the second chip 804 may comprise only the one or more readout transistors 810 and the one or more logic transistors 824, but not any of the transfer gates. In further such embodiments, the image sensor may only comprise the first chip 802 and the second chip 804 (e.g., 2-chip CIS).

In other embodiments, the first chip 802 comprises only transfer gates (e.g., transfer gate 124) and the one or more readout transistors 810, but not any of the one or more logic transistors 824. In such embodiments, the second chip 804 may comprise only the one or more logic transistors 824, but not any of the transfer gates or the one or more readout transistors 810. In further such embodiments, the image sensor may only comprise the first chip 802 and the second chip 804 (e.g., 2-chip CIS).

In other embodiments, the first chip 802 comprises only transfer gates (e.g., transfer gate 124) and the one or more logic transistors 824, but not any of the one or more readout transistors 810. In such embodiments, the second chip 804 may comprise only the one or more readout transistors 810, but not any of the transfer gates or the one or more logic transistors 824. In further such embodiments, the image sensor may only comprise the first chip 802 and the second chip 804 (e.g., 2-chip CIS).

In other embodiments, the first chip 802 may comprise the transfer gates, the one or more readout transistors 810, and the one or more logic transistors 824. In such embodiments, the image sensor may only comprise the first chip 802 (e.g., a 1-chip CIS).

Figure 9:
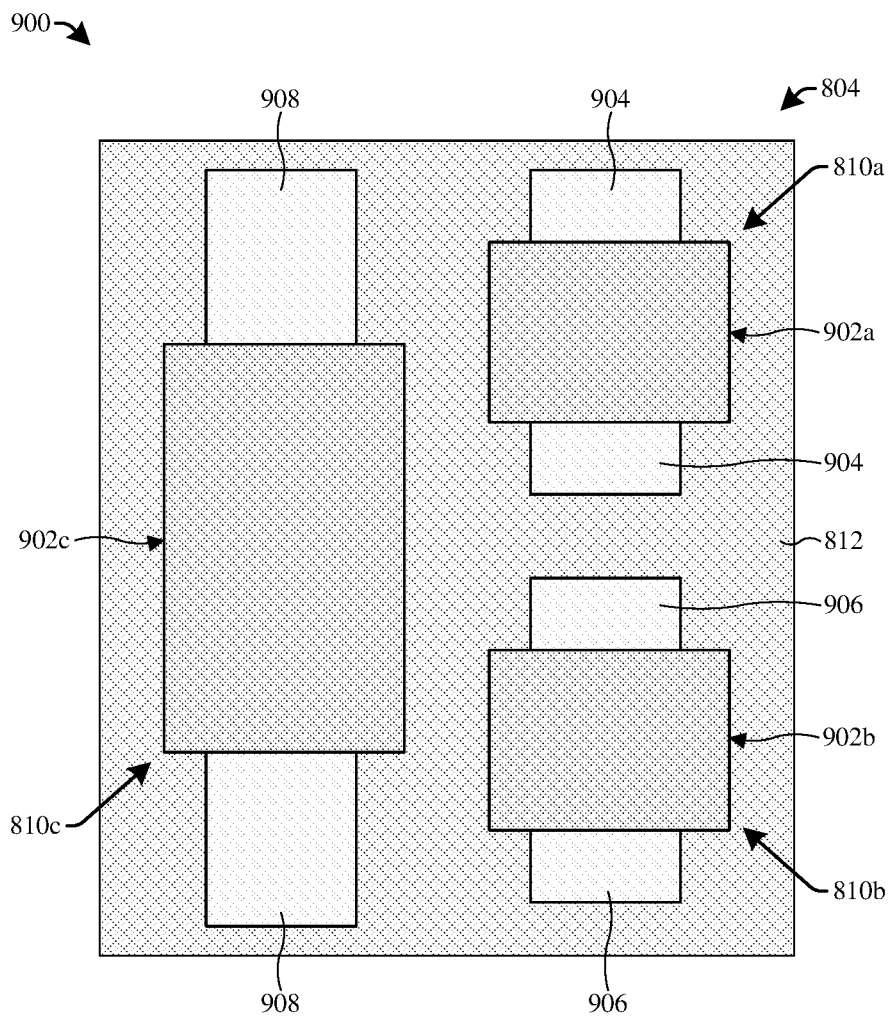
FIG. 9 illustrates a layout view of some embodiments of the second chip of the image sensor of FIG. 8.

FIG. 9 illustrates a layout view 900 of some embodiments of the second chip of the image sensor of FIG. 8.

As shown in the layout view 900 of FIG. 9, the second chip 804 comprises the one or more readout transistors 810. The one or more readout transistors 810 comprises a first readout transistor 810*a*, a second readout transistor 810*b*, and a third readout transistor 810*c*. Each of the readout transistors comprise a gate stack having a gate electrode structure overlying a gate dielectric structure. For example, the first readout transistor 810*a* comprises a first gate stack 902*a*, the second readout transistor 810*b* comprises a second gate stack 902*b*, and the third readout transistor 810*c* comprises a third gate stack 902*c*. The first gate stack 902*a* comprises a first gate electrode structure overlying a first gate dielectric structure, the second gate stack 902*b* comprises a second gate electrode structure overlying a second gate dielectric structure, and the third gate stack 902*c* comprises a third gate electrode structure overlying a third gate dielectric structure.

Each of the readout transistors comprises a pair of source/drain regions disposed on opposite sides of a corresponding gate stack. For example, the first readout transistor 810*a* comprises a first pair of source/drain regions 904 disposed on opposite sides of the first gate stack 902*a*. The second readout transistor 810*b* comprises a second pair of source/drain regions 906 disposed on opposite sides of the second gate stack 902*b*. The third readout transistor 810*c* comprises a third pair of source/drain regions 908 disposed on opposite sides of the third gate stack 902*c*.

In some embodiments, the first readout transistor 810*a* is a reset transistor, the second readout transistor 810*b* is a row-select transistor, and the third readout transistor 810*c* is a source follower transistor. In further embodiments, the layout view 900 of FIG. 9 directly overlies the layout view 100*b* of FIG. 1B, the layout view 200*b* of FIG. 2B, the layout view 300 of FIG. 3, the layout view 400 of FIG. 4, the layout view 500 of FIG. 5, or the layout view 600 of FIG. 6. While FIG. 9 illustrates only illustrates three (3) readout transistors, it will be appreciated that the second chip 804 may comprise any number of readout transistors (e.g., 1, 2, 4, 5, 6, 10, 20, etc.) configured to operate the pixel(s) (e.g., the pixel 133) of the first chip 802 (e.g., anti-bloom transistor, or other types of transistors that provide specialized functions to the pixel 133).

Figure 10:
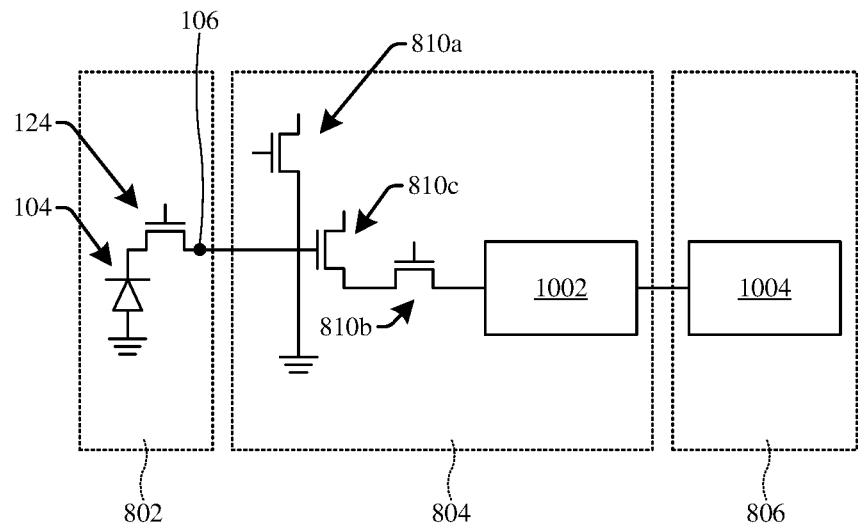
FIG. 10 illustrates a circuit diagram of some embodiments of the image sensor of FIG. 8.

FIG. 10 illustrates a circuit diagram 1000 of some embodiments of the image sensor of FIG. 8.

As shown in the circuit diagram 1000 of FIG. 10, the transfer gate 124 controls the flow of charges to (and from) the photodetector 104. For example, the transfer gate 124 controls the flow of charges accumulated in the photodetector 104 to the floating diffusion node 106. The gate electrode of the third readout transistor 810*c* and a source/drain of the first readout transistor 810*a* may be electrically coupled to the floating diffusion node 106. A first source/drain region of the second readout transistor 810*b* may be electrically coupled to a source/drain region of the third readout transistor 810*c*. A second source/drain region of the second readout transistor 810*b* may be electrically coupled to an in-pixel circuit 1002 (e.g., an electrical circuit comprising one or more in-pixel transistors). The in-pixel circuit 1002 may be electrically coupled to an application-specific integrated circuit (ASIC) 1004 (e.g., an electrical circuit comprising the logic transistors 824).

In some embodiments, the first chip comprises the photodetector 104, the transfer gate 124, and the floating diffusion node 106. In some embodiments, the second chip 804 comprises the first readout transistor 810*a*, the second readout transistor 810*b*, the third readout transistor 810*c*, and the in-pixel circuit 1002 (e.g., the in-pixel transistors). In some embodiments, the third chip 806 comprises the ASIC 1004.

Figure 11:
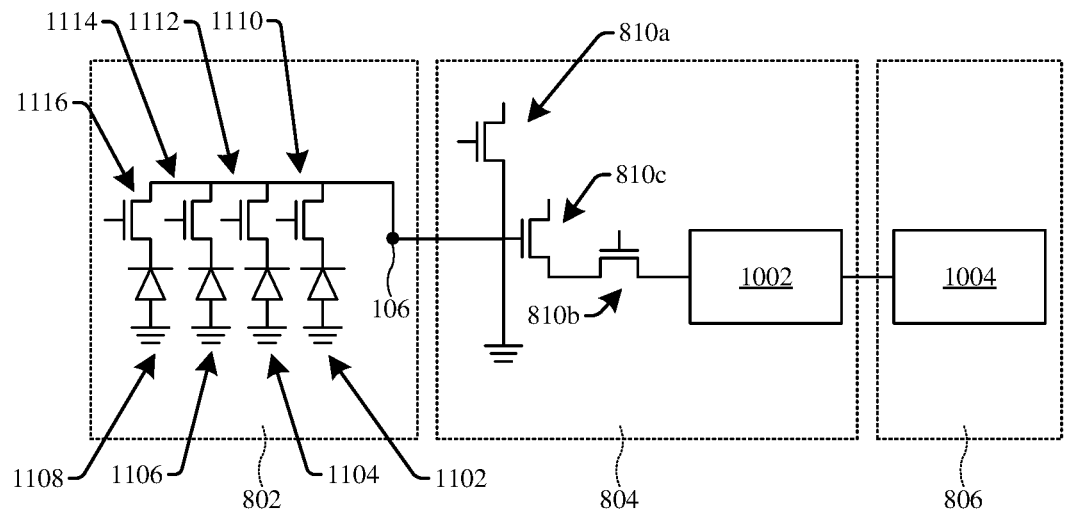
FIG. 11 illustrates a circuit diagram of some other embodiments of the circuit diagram of FIG. 10.

FIG. 11 illustrates a circuit diagram 1100 of some other embodiments of the circuit diagram of FIG. 10.

As shown in the circuit diagram 1100 of FIG. 11, the first chip 802 may comprise a plurality of photodetectors. For example, the first chip 802 may comprise a first photodetector 1102, a second photodetector 1104, a third photodetector 1106, and a fourth photodetector 1108. Each of the plurality of photodetectors may be substantially the same as the photodetector 104 (see, e.g., FIGS. 1A-1B). While the circuit diagram 1100 illustrates the first chip 802 comprising four (4) photodetectors, it will be appreciated the first chip 802 may comprise any number of photodetectors (e.g., 1, 2, 4, 8, 16, 32, 64, etc.).

The first chip 802 also comprises a plurality of transfer gates. For example, the first chip 802 may comprise a first transfer gate 1110, a second transfer gate 1112, a third transfer gate 1114, and a fourth transfer gate 1116. Each of the plurality of transfer gates may be substantially the same as the transfer gate 124 (see, e.g., FIGS. 1A-1B). While the circuit diagram 1100 illustrates the first chip 802 comprising four (4) transfer gates, it will be appreciated the first chip 802 may comprise a transfer gate for each of the photodetectors of the first chip 802 (e.g., 1, 2, 4, 8, 16, 32, 64, etc.). The plurality of transfer gates control the flow of charges to (and from) the plurality of photodetectors, respectively. For example, the first transfer gate 1110 controls the flow of charges accumulated in the first photodetector 1102 to the floating diffusion node 106, the second transfer gate 1112 controls the flow of charges accumulated in the second photodetector 1104 to the floating diffusion node 106, the third transfer gate 1114 controls the flow of charges accumulated in the third photodetector 1106 to the floating diffusion node 106, and the fourth transfer gate 1116 controls the flow of charges accumulated in the fourth photodetector 1108 to the floating diffusion node 106.

FIGS. 12-24 illustrate a series of cross-sectional views 1200-2400 of some embodiments of a method for forming an image sensor comprising a first gate dielectric structure having a first thickness and a second gate dielectric structure having a second thickness greater than the first thickness.

Figure 12:
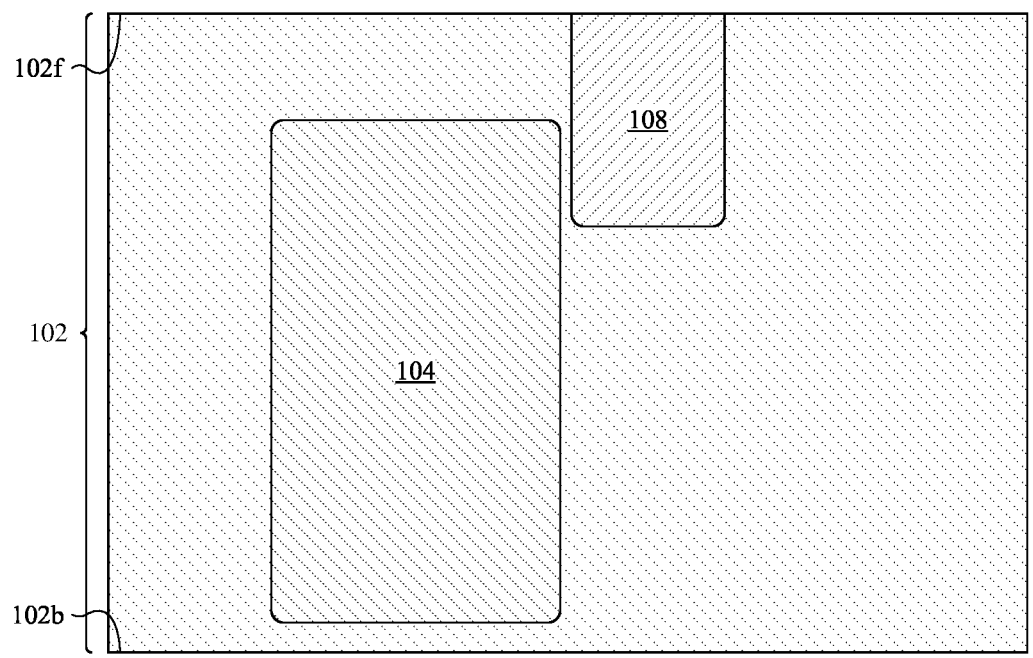
FIGS. 12-24 illustrate a series of cross-sectional views of some embodiments of a method for forming an image sensor comprising a first gate dielectric structure having a first thickness and a second gate dielectric structure having a second thickness greater than the first thickness.

As shown in the cross-sectional view 1200 of FIG. 12, a photodetector 104 is formed in a substrate 102. The photodetector 104 comprises a region of the substrate 102 having a first doping type (e.g., n-type/p-type) opposite a second doping type (e.g., p-type/n-type). In some embodiments, the photodetector 104 may be formed by a doping process (e.g., via ion implantation, diffusion, etc.) that utilizes a masking layer (not shown) (e.g., positive/negative photoresist, hardmask, etc.) on the front side 102f of the substrate 102 to selectively implant first doping type dopants (e.g., n-type dopants) into the substrate 102. Subsequently, in some embodiments, the masking layer is stripped away (e.g., via a plasma ashing process).

Also shown in the cross-sectional view 1200 of FIG. 12, in some embodiments, a doped well 108 is formed in the substrate 102. The doped well 108 is a region of the substrate 102 having the second doping type. In some embodiments, the doped well 108 is formed laterally spaced from the photodetector 104. In some embodiments, the doped well 108 may be formed by a doping process (e.g., via ion implantation, diffusion, etc.) that utilizes a masking layer (not shown) (e.g., positive/negative photoresist, hardmask, etc.) on the front side 102f of the substrate 102 to selectively implant second doping type dopants (e.g., p-type dopants) into the substrate 102. Subsequently, in some embodiments, the masking layer is stripped away.

Figure 13:
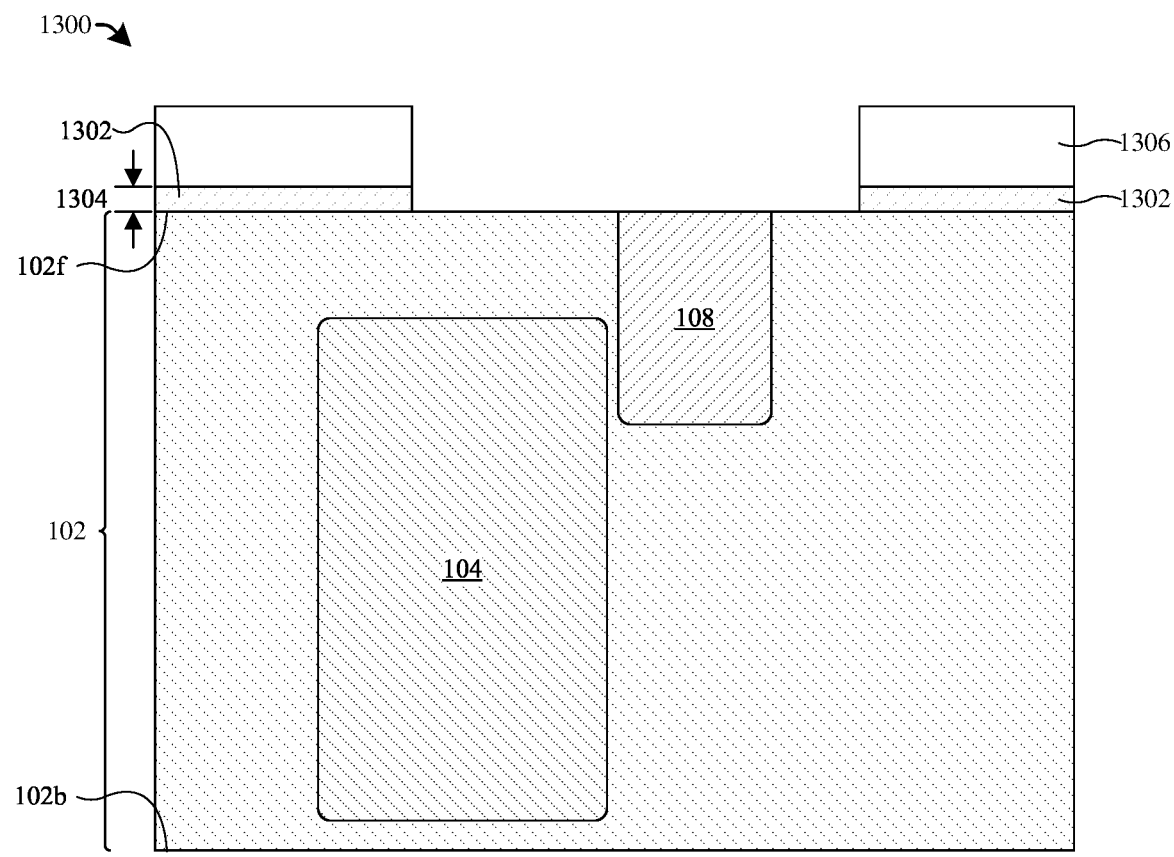

As shown in the cross-sectional view 1300 of FIG. 13, a first gate dielectric layer 1302 is formed over the front side 102f of the substrate 102. In some embodiments, first gate dielectric layer 1302 is formed on the front side 102f of the substrate 102. The first gate dielectric layer 1302 is formed with a third thickness 1304. The first gate dielectric layer 1302 may be or comprise, for example, an oxide (e.g., $SiO_2$), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing.

In some embodiments, a process for forming the first gate dielectric layer 1302 comprises depositing or growing (e.g., blanket deposition/growth) a dielectric material on the front side 102f of the substrate 102. The dielectric material may be or comprise, for example, an oxide (e.g., $SiO_2$), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. The dielectric material may be deposited or grown by, for example, chemical vapor deposition (CVD), physical vapor deposition (PVD), atomic layer deposition (ALD), thermal oxidation, sputtering, some other deposition or growth process, or a combination of the foregoing.

Thereafter, a patterned masking layer 1306 (e.g., positive/negative photoresist, a hardmask, etc.) is formed over the dielectric material. In some embodiments, a process for forming the patterned masking layer 1306 comprises depositing a masking layer (not shown) on the dielectric material. The masking layer may be deposited by, for example, CVD, PVD, ALD, a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer 1306 over the dielectric material.

With the patterned masking layer 1306 in place over the dielectric material, an etching process is then performed on the dielectric material. The etching process removes unmasked portions of the dielectric material, thereby forming the first gate dielectric layer 1302 over the front side 102f of the substrate 102. The etching process may be or comprise, for example, a wet etching process, a dry etching process, a reactive ion etching (RIE) process, some other etching process, or a combination of the foregoing. Subsequently, in some embodiments, the patterned masking layer 1306 is stripped away.

Figure 14:
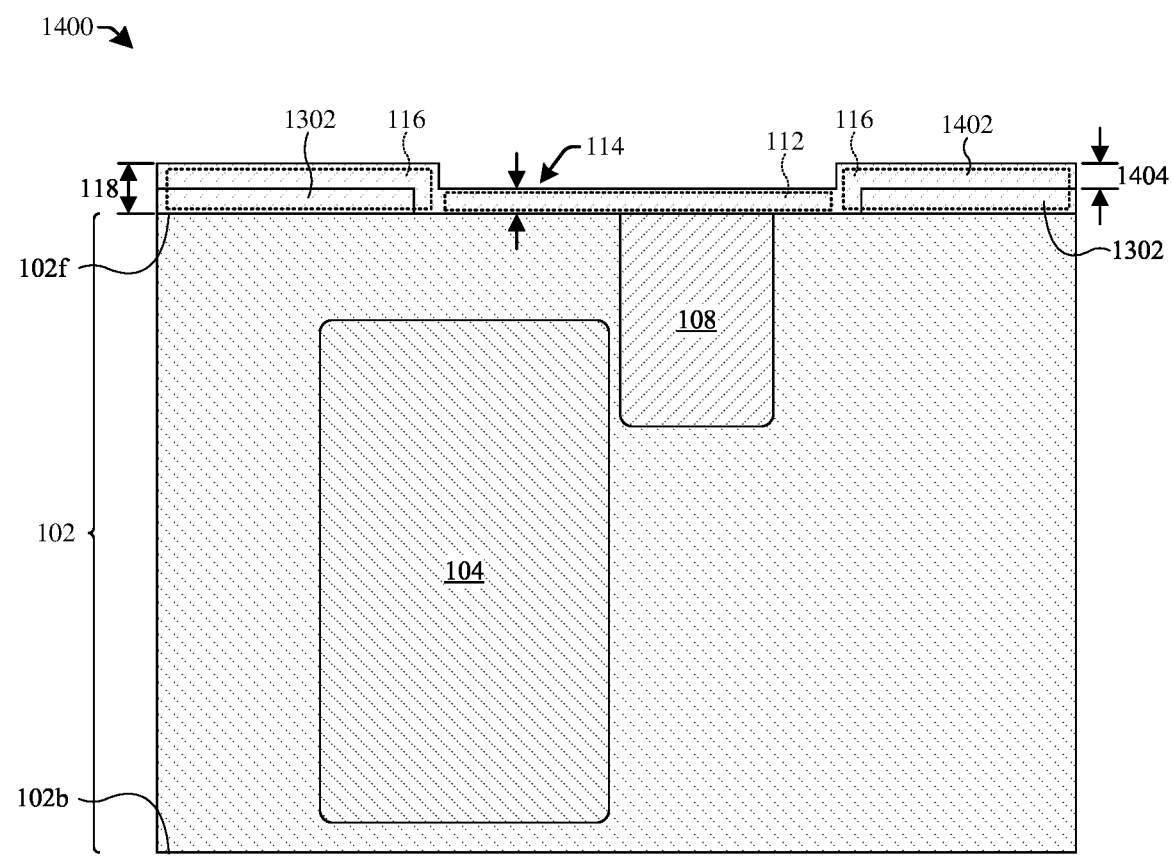

As shown in the cross-sectional view 1400 of FIG. 14, a second gate dielectric layer 1402 is formed over the front side 102f of the substrate 102 and the first gate dielectric layer 1302. The second gate dielectric layer 1402 is formed with a fourth thickness 1404. In some embodiments, the fourth thickness 1404 is substantially the same as the third thickness 1304. In other embodiments, the fourth thickness 1404 is different than (e.g., greater than or less than) the third thickness 1304. The fourth thickness 1404 is the same as the first thickness 114 (see, FIGS. 1A-1B). A sum of the third thickness 1304 (see, FIG. 13) and the fourth thickness 1404 is the same as the second thickness 118.

The second gate dielectric layer 1402 may be or comprise, for example, an oxide (e.g., $SiO_2$), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In some embodiments, the second gate dielectric layer 1402 has a same chemical composition as the first gate dielectric layer 1302. In other embodiments, the second gate dielectric layer 1402 has a different chemical composition than the first gate dielectric layer 1302.

In some embodiments, a process for forming the second gate dielectric layer 1402 comprises depositing (e.g., blanket deposition) the second gate dielectric layer 1402 on the front side 102f of the substrate 102 and on the first gate dielectric layer 1302. The second gate dielectric layer 1402 may be deposited, for example, CVD, PVD, ALD, sputtering, some other deposition process, or a combination of the foregoing.

In some embodiments, by forming the first gate dielectric layer 1302 and the second gate dielectric layer 1402, a first gate dielectric structure 112 and a second gate dielectric structure 116 are formed over the front side 102f of the substrate 102. In other words, in some embodiments, the first gate dielectric structure 112 and the second gate dielectric structure 116 are formed by forming the first gate dielectric layer 1302 and the second gate dielectric layer 1402. In some embodiments, the second gate dielectric structure 116 comprises the first gate dielectric layer 1302 and a first portion of the second gate dielectric layer 1402, as shown in the cross-sectional view 1400 of FIG. 14. In further embodiments, the first gate dielectric structure 112 comprises a second portion of the second gate dielectric layer 1402, as shown in the cross-sectional view 1400 of FIG. 14. The first gate dielectric structure 112 is formed with the first thickness 114. The second gate dielectric structure 116 is formed with the second thickness 118.

While FIGS. 13-14 illustrate a possible process for forming the first gate dielectric structure 112 and the second gate dielectric structure 116, it will be appreciated that the first gate dielectric structure 112 and the second gate dielectric structure 116 may be formed by other process(es). For example, in some embodiments, the first gate dielectric structure 112 (or the second gate dielectric structure 116) may be formed by a first formation process (e.g., growth/deposition process) and a patterning process; and then after the first gate dielectric structure 112 (or the second gate dielectric structure 116) is formed, forming the second gate dielectric structure 116 (or the first gate dielectric structure 112) via a second formation process (e.g., masking the first gate dielectric structure 112 and then performing another growth/deposition process).

Figure 15:
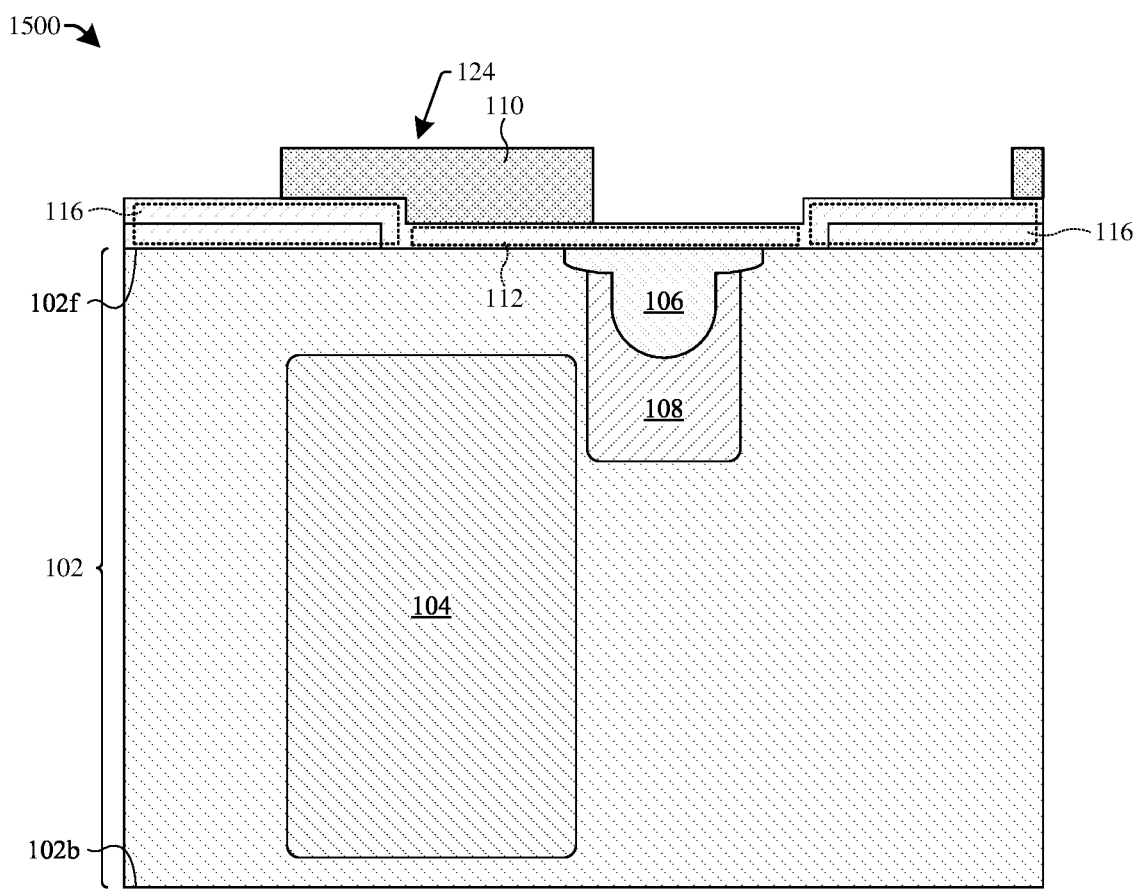

As shown in the cross-sectional view 1500 of FIG. 15, a gate electrode structure 110 is formed over front side 102f of the substrate 102, over the first gate dielectric structure 112, and over the second gate dielectric structure 116. The gate electrode structure 110 is formed partially overlying the first gate dielectric structure 112. The gate electrode structure 110 is formed partially overlying the second gate dielectric structure 116.

In some embodiments, a process for forming the gate electrode structure 110 comprises forming a gate electrode layer (not shown) over both the first gate dielectric structure 112 and the second gate dielectric structure 116. Thereafter, a patterned masking layer is formed over the gate electrode layer. The patterned masking layer may be formed by depositing a masking layer (not shown) on both the first gate dielectric structure 112 and the second gate dielectric structure 116 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the gate electrode layer to selectively etch the gate electrode layer according to the patterned masking layer. The etching process removes unmasked portions of the gate electrode layer, thereby forming the gate electrode structure 110. In some embodiments, the etching process may be or comprise, for example, a wet etching process, a dry etching process, a RIE process, some other etching process, or a combination of the foregoing. Subsequently, the patterned masking layer is stripped away. In some embodiments, forming the gate electrode structure 110 completes the formation of a transfer gate 124.

Also shown in the cross-sectional view 1500 of FIG. 15, a floating diffusion node 106 is formed in the substrate 102. The floating diffusion node 106 is a region of the substrate 102 having the first doping type. In some embodiments, the floating diffusion node 106 may be formed by a doping process (e.g., via (angled) ion implantation, diffusion, etc.) that utilizes a masking layer (not shown) (e.g., positive/negative photoresist, hardmask, etc.) on the front side 102f of the substrate 102 to selectively implant first doping type dopants (e.g., n-type dopants) into the substrate 102. In some embodiments, the gate electrode structure 110 is utilized, at least partially, as the masking layer. Subsequently, in some embodiments, the masking layer is stripped away.

Figure 16:
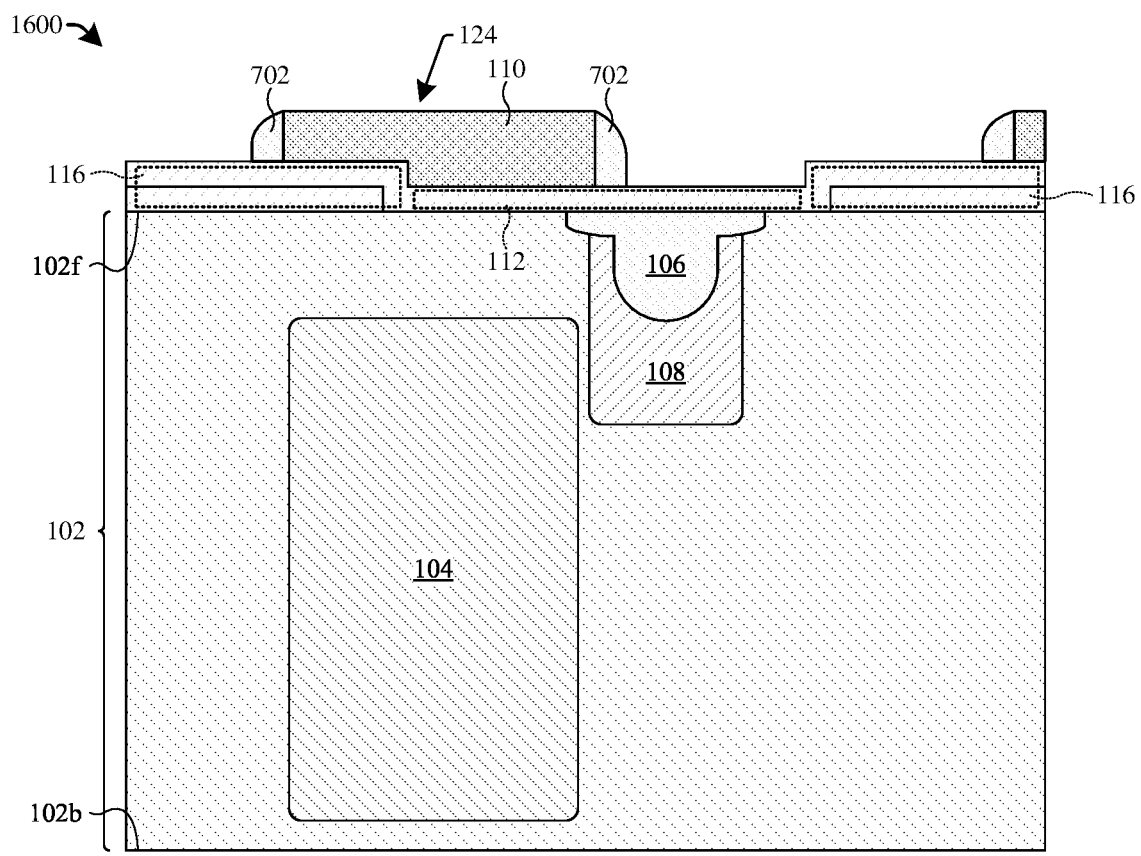

As shown in the cross-sectional view 1600 of FIG. 16, a sidewall spacer 702 is formed along sidewalls of the gate electrode structure 110. The sidewall spacer 702 is formed over both the first gate dielectric structure 112 and the second gate dielectric structure 116. In some embodiments, a process for forming the sidewall spacer 702 comprises depositing a spacer layer (not shown) over the first gate dielectric structure 112, the second gate dielectric structure 116, and the gate electrode structure 110. The spacer layer may be deposited by, for example, CVD, PVD, ALD, some other deposition process, or a combination of the foregoing. Thereafter, horizontal portions of the spacer layer are etched away (e.g., via an anisotropic etching process), thereby leaving vertical portions of the spacer layer in place as the sidewall spacer 702.

Figure 17:
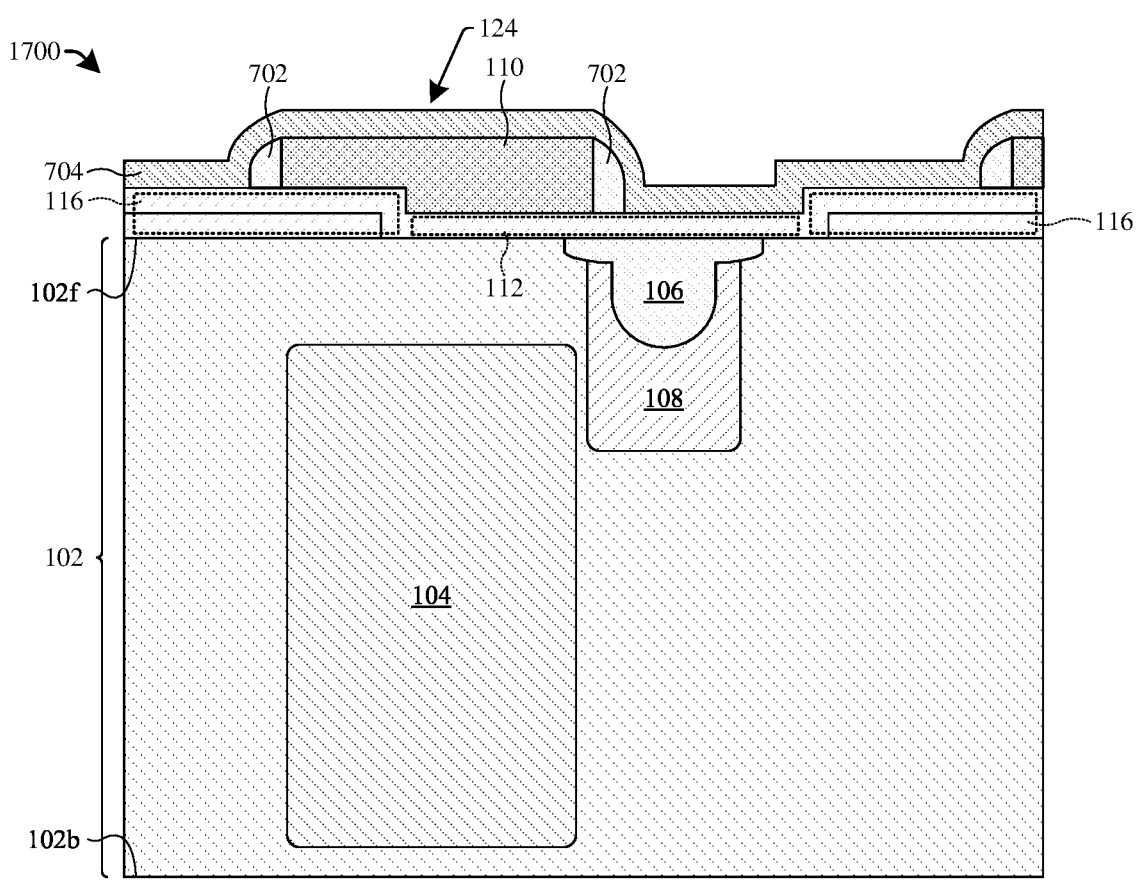

As shown in the cross-sectional view 1700 of FIG. 17, a contact etch stop layer (CESL) 704 is formed over the first gate dielectric structure 112, the second gate dielectric structure 116, the gate electrode structure 110, and the sidewall spacer 702. In some embodiments, a process for forming the CESL 704 comprises depositing the CESL 704 on the first gate dielectric structure 112, the second gate dielectric structure 116, the gate electrode structure 110, and the sidewall spacer 702. The CESL 704 may be deposited by, for example, CVD. PVD, ALD, some other deposition process, or a combination of the foregoing.

Figure 18:
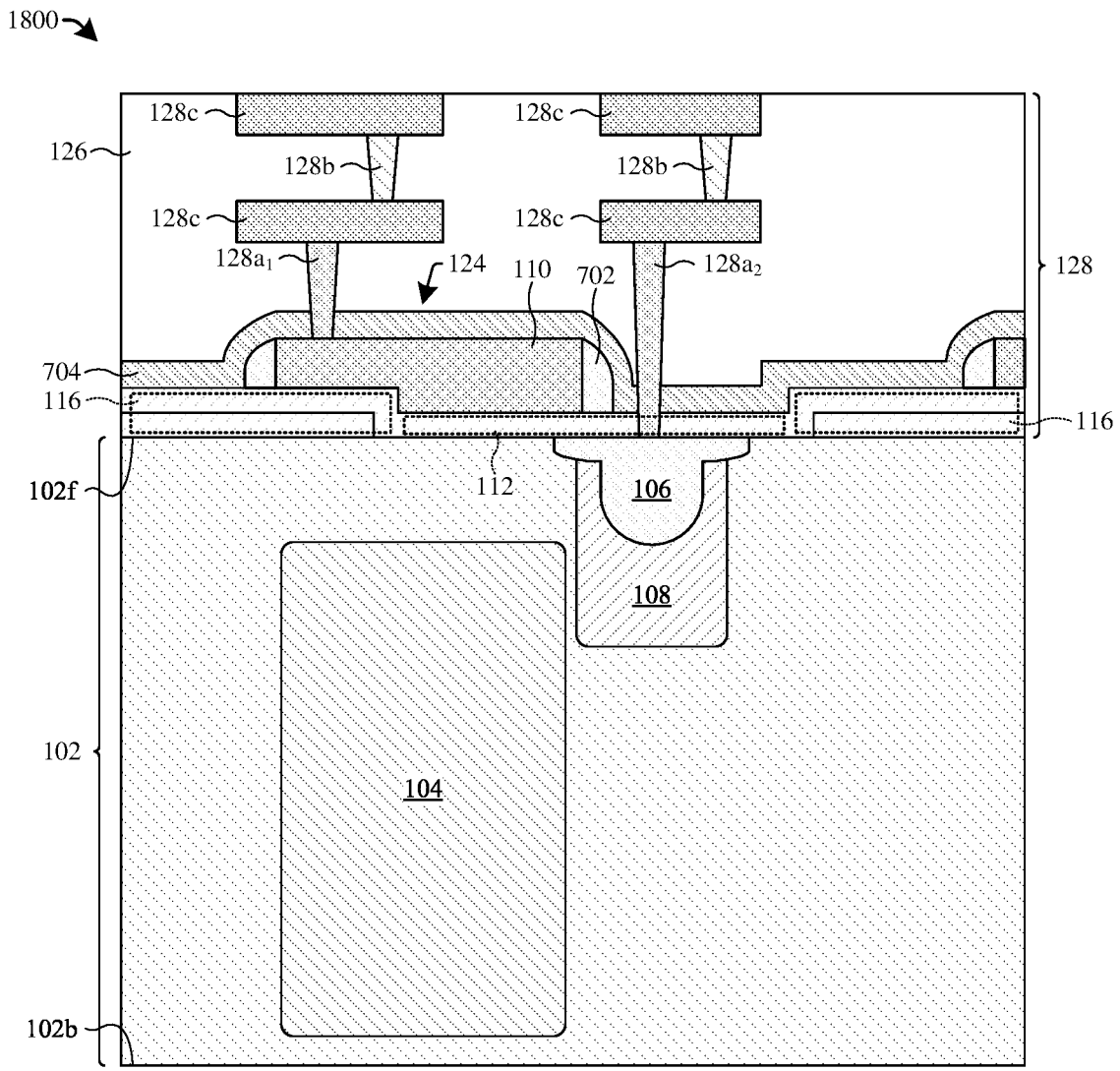

As shown in the cross-sectional view 1800 of FIG. 18, an ILD structure 126 is formed over the front side 102f of the substrate 102. The ILD structure 126 is also formed over the first gate dielectric structure 112, the second gate dielectric structure 116, the gate electrode structure 110, the sidewall spacer 702, and the CESL 704. Also shown in the cross-sectional view 1800 of FIG. 18, an interconnect structure 128 is formed in the ILD structure 126 and over the front side 102f of the substrate 102. In some embodiments, the interconnect structure 128 comprises a plurality of conductive contacts 128a, a plurality of conductive vias 128b, and a plurality of conductive wires 128c. The plurality of conductive contacts 128a may comprise a first conductive contact $128a_1$ and a second conductive contact $128a_2$.

In some embodiments, a process for forming the ILD structure 126 and the interconnect structure 128 comprises forming a first ILD layer over the front side 102f of the substrate 102. Thereafter, contact openings are formed in the first ILD layer. A conductive material (e.g., tungsten (W)) is then formed on the first ILD layer and in the contact openings. Thereafter, a planarization process (e.g., chemical-mechanical planarization (CMP)) is performed on the conductive material to form the plurality of conductive contacts 128a in the first ILD layer. A second ILD layer is then formed over the first ILD layer and the plurality of conductive contacts 128a. A plurality of trenches are then formed in the second ILD layer. A conductive material (e.g., copper (Cu)) is formed on the second ILD layer and in the trenches. Thereafter, a planarization process (e.g., CMP) is performed into the conductive material to form a first group of conductive wires of the plurality of conductive wires 128c (e.g., the conductive wires of a first layer of conductive wires (e.g., metal layer 1)).

Thereafter, the plurality of conductive vias 128b and the remaining conductive wires of the plurality of conductive wires 128c of the interconnect structure 128 may be formed by repeating a damascene process (e.g., a single damascene process or a dual damascene process) until a predefined number of conductive vias and conductive wires are formed in the ILD structure 126. The damascene process may be performed by depositing a subsequent ILD layer over the second ILD layer and the first group of conductive wires of the plurality of conductive wires 128c, etching the subsequent ILD layer to form one or more via holes and/or one or more trenches in the subsequent ILD layer, and filling the one or more via holes and/or the one or more trenches with a conductive material (e.g., copper (Cu)). Thereafter, a planarization process (e.g., CMP) is performed on the conductive material, thereby forming a second group of conductive wires of the plurality of conductive wires 128c (e.g., the conductive wires of a second layer of conductive wires (e.g., metal layer 2)) and/or the conductive vias of the plurality of conductive vias 128b that extend vertically between the first group and the second group of conductive wires. This damascene process is repeated until each of the plurality of conductive vias 128b and each of the plurality of conductive wires 128c of the interconnect structure 128 are formed in the ILD structure 126. The ILD layers may be formed by, for example, CVD, PVD, ALD, some other deposition process, or a combination of the foregoing. The conductive material(s) (e.g., tungsten (W), copper (Cu), etc.) may be formed using a deposition process (e.g., CVD, PVD, sputtering, etc.) and/or a plating process (e.g., electrochemical plating, electroless plating, etc.).

Figure 19:
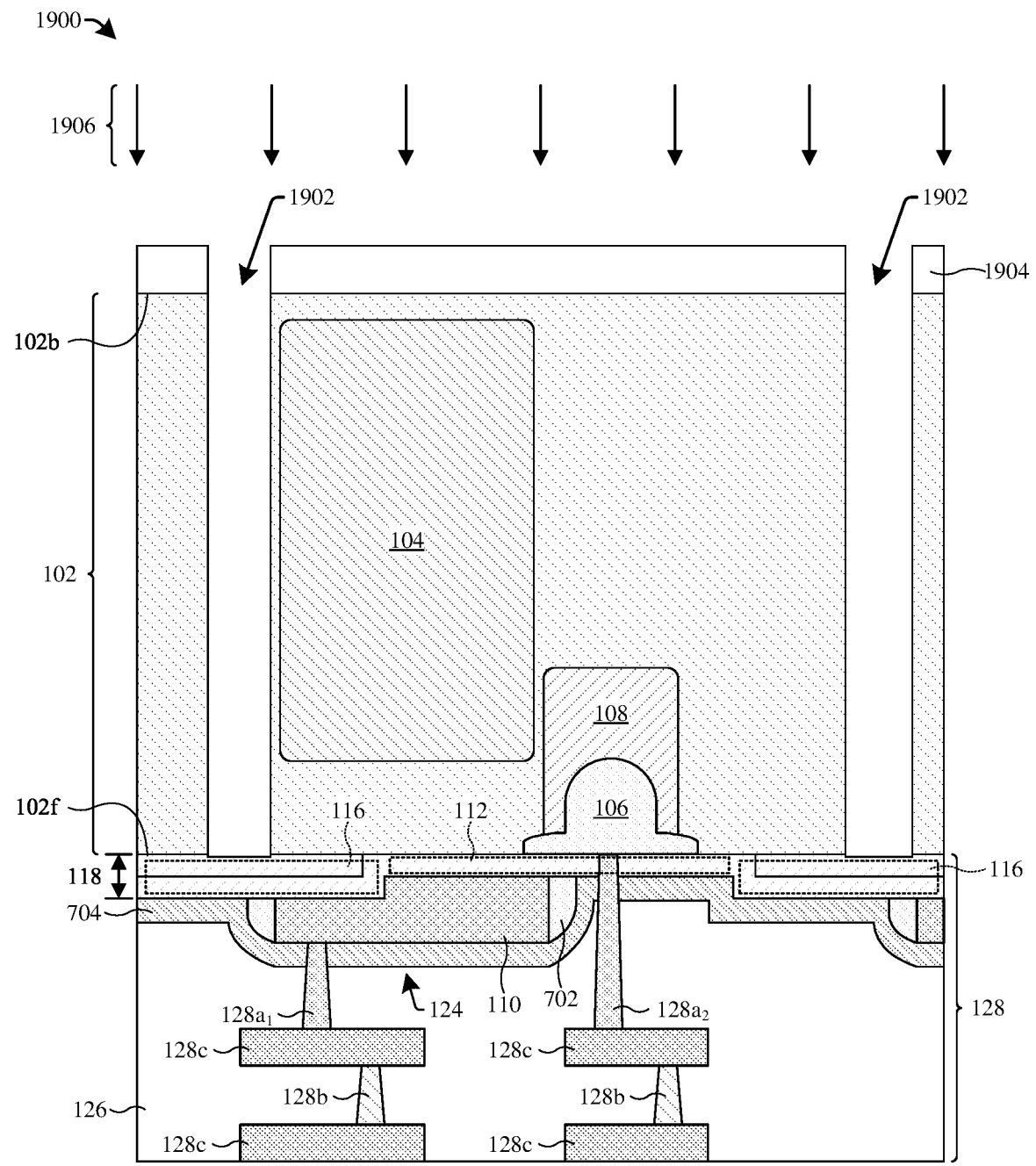

As shown in the cross-sectional view 1900 of FIG. 19, a trench 1902 is formed in the substrate 102. The trench 1902 extends into the substrate 102 from the back side 102b of the substrate 102. The trench 1902 is formed over (e.g., directly over) the second gate dielectric structure 116.

In some embodiments, the trench 1902 extends from the back side 102b (e.g., the back side surface) of the substrate 102 vertically through the substrate 102 to at least the front side 102f (e.g., the front side surface) of the substrate 102 (e.g., the trench 1902 extends completely through the substrate 102). In further embodiments, the trench 1902 is formed penetrating the second gate dielectric structure 116 (e.g., formed extending, at least partially, vertically through the second gate dielectric structure 116), as shown in the cross-sectional view 1900 of FIG. 19. In such embodiments, the trench 1902 exposes a portion of the second gate dielectric structure 116. In some embodiments, the portion of the second gate electrode exposed by the trench 1902 is disposed laterally between opposite sides of the gate electrode structure 110 (see, e.g., FIGS. 2A-2B).

The trench 1902 is formed extending laterally through the substrate 102. In some embodiments, the trench 1902 is formed extending laterally through the substrate 102 in a closed loop path. In some embodiments, the trench 1902 is formed laterally surrounding the photodetector 104. In further embodiments, the trench 1902 is formed laterally surrounding the floating diffusion node 106 (and the doped well 108).

In some embodiments, a process for forming the trench 1902 comprises forming a patterned masking layer 1904 over the back side 102b of the substrate 102. In some embodiments, a process for forming the patterned masking layer 1904 comprises flipping (e.g., rotating 180 degrees) the structure illustrated in FIG. 18 so that the back side 102b of the substrate 102 is facing upward. Thereafter, a masking layer (not shown) is deposited on the back side 102b of the substrate 102. The masking layer may be deposited by, for example, CVD, PVD. ALD, a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer 1904 over the back side 102b of the substrate 102.

With the patterned masking layer 1904 in place over the back side 102b of the substrate 102, an etching process 1906 is then performed on the substrate 102. The etching process 1906 removes unmasked portions of the substrate 102, thereby forming the trench 1902 in the substrate 102. The etching process may be or comprise, for example, a wet etching process, a dry etching process, a RIE process, some other etching process, or a combination of the foregoing. Subsequently, in some embodiments, the patterned masking layer 1904 is stripped away.

Because the second gate dielectric structure 116 has the second thickness 118 and because the trench 1902 is formed over (e.g., directly over) the second gate dielectric structure 116, the etching process 1906 may not undesirably etch through (e.g., completely through) the second gate dielectric structure 116 and damage features (e.g., the gate electrode structure 110, the interconnect structure 128, etc.) disposed on the front side 102f of the substrate 102. In other words, the second gate dielectric structure 116 may be utilized to provide a safe landing area for forming the trench 1902. Thus, dimensions of the image sensor may be smaller than (e.g., scaled down more than) a typical image sensor (e.g., the image sensor may improve the ability to scale down the dimensions of images sensors due to the second gate dielectric structure 116 being a safe landing area for forming the trench 1902).

Figure 20:
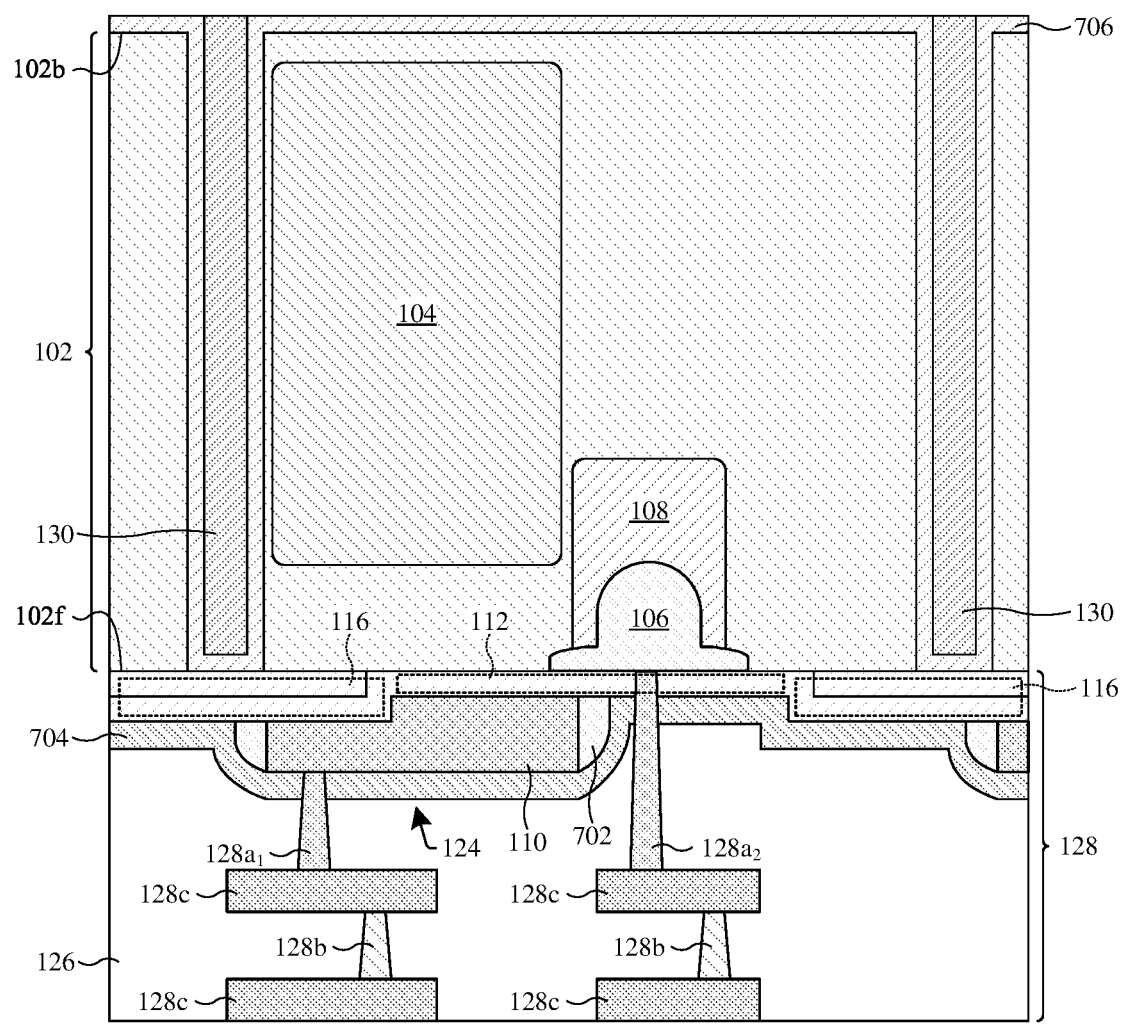

As shown in the cross-sectional view 2000 of FIG. 20, a dielectric layer 706 is formed in the trench 1902 and over the back side 102b of the substrate 102. The dielectric layer 706 is formed lining surfaces (e.g., sidewalls and lower surfaces) of the trench 1902. In some embodiments, the dielectric layer 706 is formed contacting (e.g., directly contacting) the second gate dielectric structure 116, as shown in the cross-sectional view 2000 of FIG. 20. More specifically, the dielectric layer 706 is formed contacting the portion of the second gate dielectric structure 116 that was exposed by the trench 1902 (see, FIG. 19). In other embodiments, the dielectric layer 706 is omitted. In some embodiments, a process for forming the dielectric layer 706 comprises depositing the dielectric layer 706 on the back side 102b of the substrate 102 and along the surfaces of the trench 1902. The dielectric layer 706 may be deposited by, for example, CVD, PVD, ALD, some other deposition process, or a combination of the foregoing.

Also shown in the cross-sectional view 2000 of FIG. 20, a DTI structure 130 is formed in the trench 1902. The DTI structure 130 is formed extending into the substrate 102 from the back side 102b of the substrate 102. The DTI structure 130 is formed over (e.g., directly over) the second gate dielectric structure 116.

In some embodiments, the DTI structure 130 extends from the back side 102b (e.g., the back side surface) of the substrate 102 vertically through the substrate 102 to at least the front side 102f (e.g., the front side surface) of the substrate 102 (e.g., the DTI structure 130 extends completely through the substrate 102). In further embodiments, the DTI structure 130 may be formed penetrating the second gate dielectric structure 116 (e.g., extending, at least partially, vertically into the second gate dielectric structure 116).

The DTI structure 130 is formed extending laterally through the substrate 102. In some embodiments, the DTI structure 130 is formed extending laterally through the substrate 102 in a closed loop path. In some embodiments, the DTI structure 130 is formed laterally surrounding the photodetector 104. In further embodiments, the DTI structure 130 is formed laterally surrounding the floating diffusion node 106 (and the doped well 108).

In some embodiments, a process for forming the DTI structure 130 comprises depositing a dielectric material on the dielectric layer 706 and filling the trench 1902. In some embodiments, the dielectric material is also formed over the dielectric layer 706 and over the back side 102b of the substrate 102. In some embodiments, the dielectric material may be or comprise, for example, an oxide (e.g., SiO$_2$), a nitride (e.g., SiN), an oxy-nitride (e.g., SiON), tetracthoxysilane (TEOS), some other dielectric material, or a combination of the foregoing. In some embodiments, the dielectric material has a different chemical composition than the dielectric layer 706. Thereafter, a planarization process (e.g., CMP) is performed on the dielectric material to remove an upper portion of the dielectric material, thereby leaving a lower portion of the dielectric material in the trench 1902 as the DTI structure 130.

Figure 21:
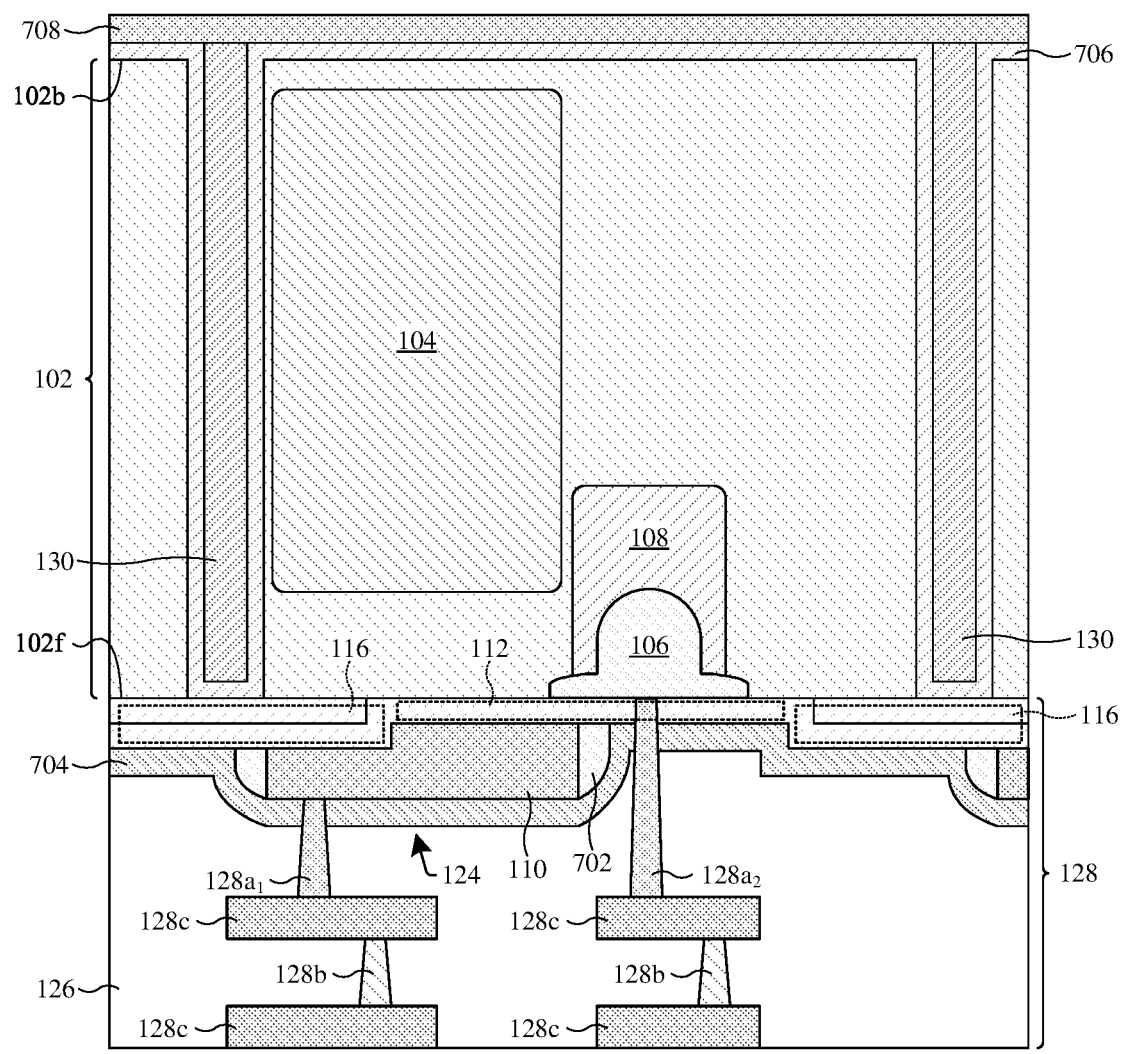

As shown in the cross-sectional view 2100 of FIG. 21, a light transmission structure 708 is formed along/over the dielectric layer 706 and the DTI structure 130. In some embodiments, a process for forming the light transmission structure 708 comprises depositing the light transmission structure 708 on the dielectric layer 706 and the DTI structure 130. The light transmission structure 708 may be deposited by, for example, CVD, PVD, ALD, a spin-on process, sputtering, some other deposition process, or a combination of the foregoing.

Figure 22:
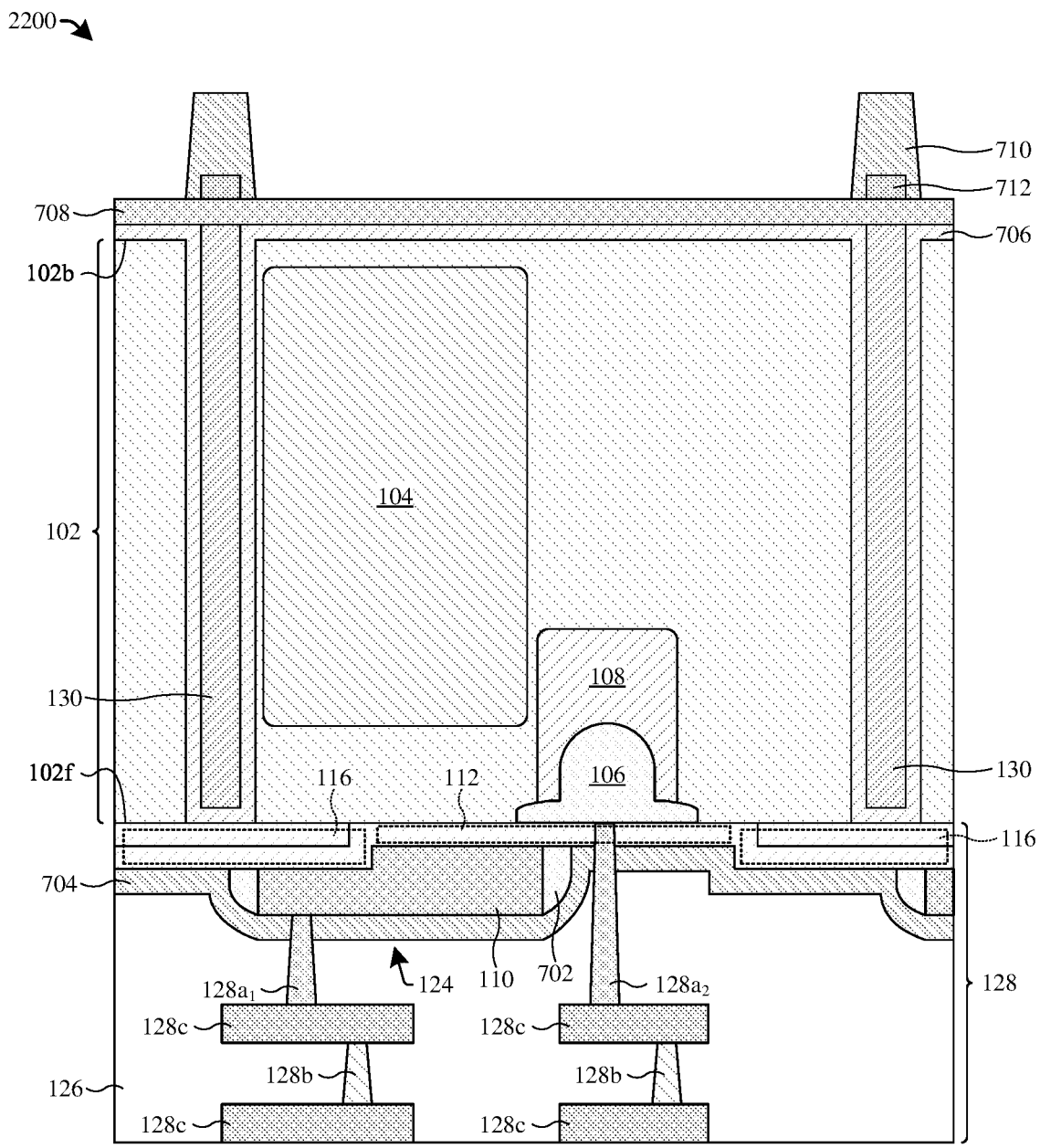

As shown in the cross-sectional view 2200 of FIG. 22, a metal grid 712 is formed on/over the light transmission structure 708. In some embodiments, a process for forming the metal grid 712 comprises forming a patterned masking layer (not shown), which has a trench disposed therein, on the light transmission structure 708. Thereafter, a metal material is depositing on the patterned masking layer and in the trench. The metal material may be or comprise, for example, aluminum (Al), cobalt (Co), copper (Cu), silver (Ag), gold (Au), tungsten (W), some other metal, or a combination of the foregoing. Thereafter, a planarization process is performed (e.g., CMP etch back process, etc.) on the metal material to remove an upper portion of the metal material, thereby leaving lower portions of the metal material in the trench as the metal grid 712. Subsequently, in some embodiments, the masking layer is stripped away Also shown in the cross-sectional view 2200 of FIG. 22, a dielectric grid 710 is formed over the light transmission structure 708 and over the metal grid 712. The dielectric grid 710 is formed overlying the metal grid 712. In some embodiments, a process for forming the dielectric grid 710 comprises depositing a dielectric material on/over the light transmission structure 708 and on/over the metal grid 712. The dielectric material may be or comprise, for example, an oxide (e.g., SiO2), a nitride (e.g., SiN), a carbide (e.g., SiC), a high-k dielectric (e.g., HfO, TaO, etc.), a low-k dielectric, some other dielectric, or a combination of the foregoing.

Thereafter, a patterned masking layer is formed over the dielectric material. An etching process is then performed on the dielectric material to remove unmasked portions of the dielectric material, thereby leaving masked portions of the dielectric material in place as the dielectric grid. The etching process may be or comprise, for example, a wet etching process, a dry etching process, a RIE process, some other etching process, or a combination of the foregoing. Subsequently, in some embodiments, the patterned masking layer is stripped away.

Figure 23:
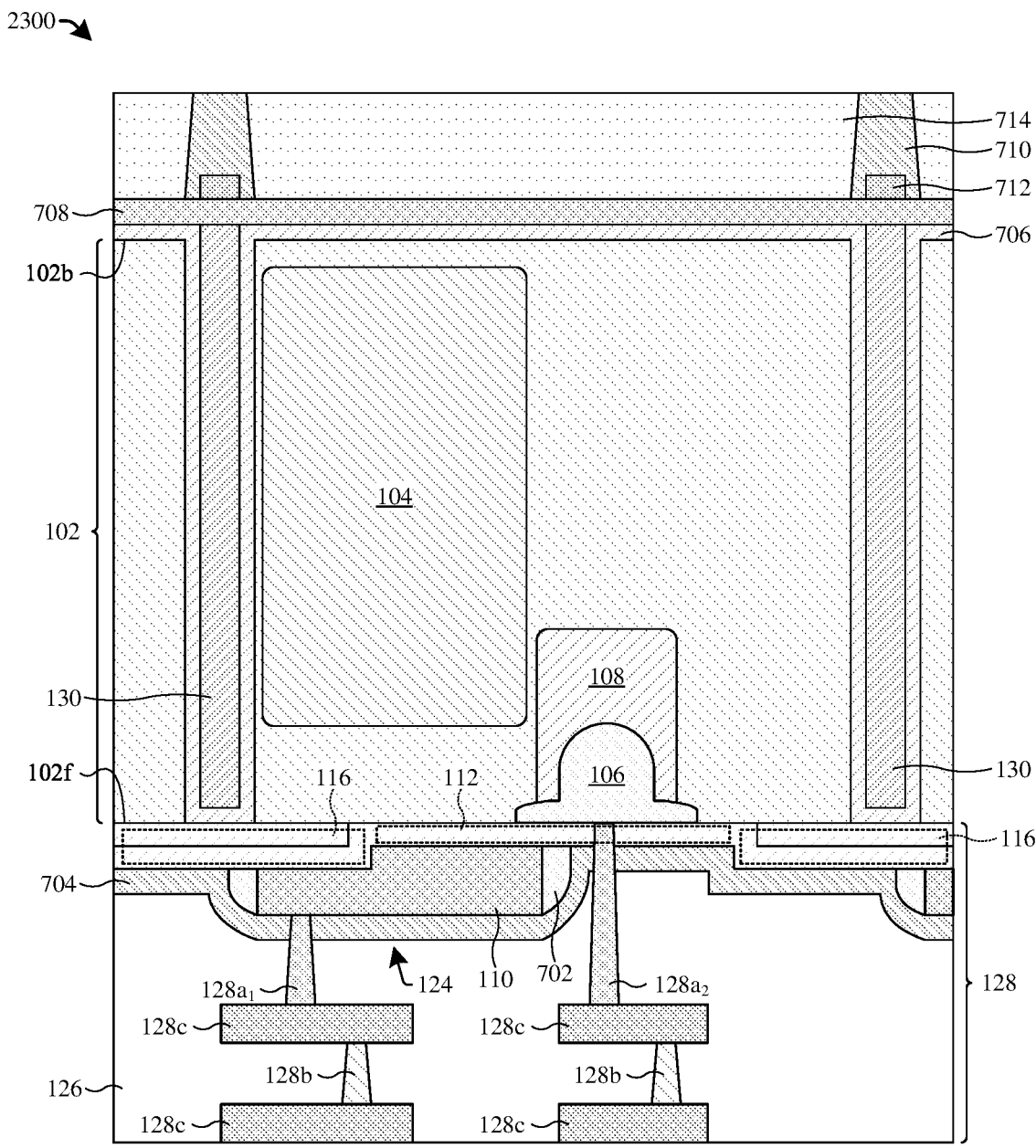

As shown in the cross-sectional view 2300 of FIG. 23, an electromagnetic radiation (EMR) filter 714 (e.g., infrared filter, color filter, etc.) is formed on/over the light transmission structure 708 and within the dielectric grid 710. In some embodiments, a process for forming the EMR filter 714 comprises depositing (e.g., via CVD, PVD, ALD, sputtering, a spin-on process, etc.) a light filtering material(s) onto the light transmission structure 708 and within the dielectric grid 710. The light filtering material(s) is a material that allows for the transmission of radiation (e.g., light) having a specific wavelength range, while blocking light of wavelengths outside of the specified range. Subsequently, in some embodiments, a planarization process (e.g., CMP) may be performed on the EMR filter 714 to planarize the upper surface of the EMR filter 714.

Figure 24:
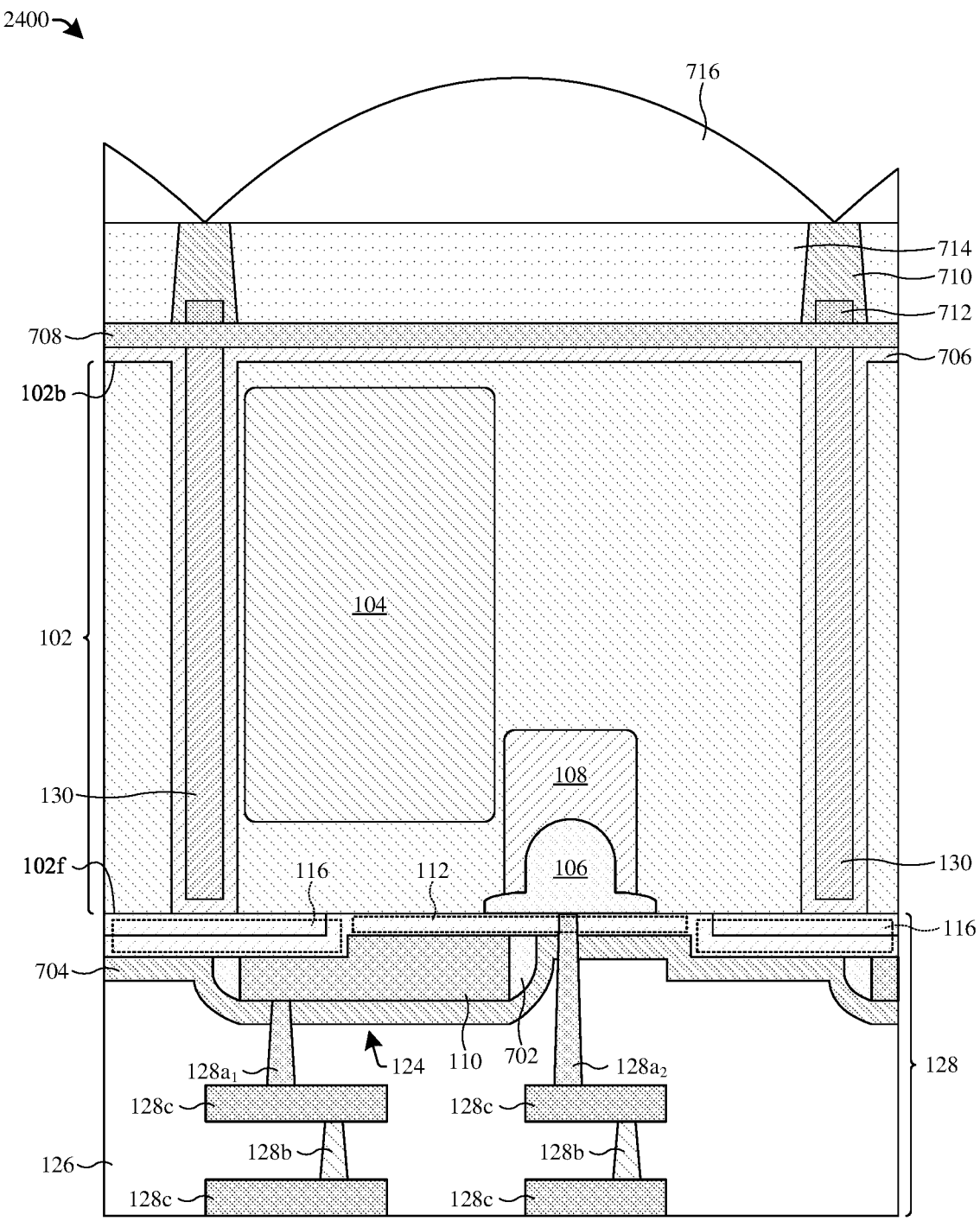

As shown in the cross-sectional view 2400 of FIG. 24, a micro-lens 716 is formed on/over the EMR filter 714. In some embodiments, the micro-lens 716 may be formed by depositing a micro-lens material on the EMR filter 714 and the dielectric grid 710 (e.g., via CVD, PVD, ALD, sputtering, a spin-on process, etc.). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed, and baked to form a rounding shape. The micro-lens 716 is then formed by selectively etching the micro-lens material according to the micro-lens template. In some embodiments, after the micro-lens 716 are formed, formation of the image sensor (see, e.g., FIGS. 1A-1B) is complete.

For clarity, it will be appreciated that spatially relative terms (e.g., over, under, upper, lower, etc.) used herein to describe the structures illustrated in the figures are generally based on the orientation of such structures as illustrated in their respective figures. For example, in describing the structure illustrated in FIG. 24, it may be said that the micro-lens 716 is formed over the EMR filter 714. On the other hand, in describing the structure illustrated in FIG. 7, it may be said that the EMR filter 714 overlies the micro-lens 716.

Figure 25:
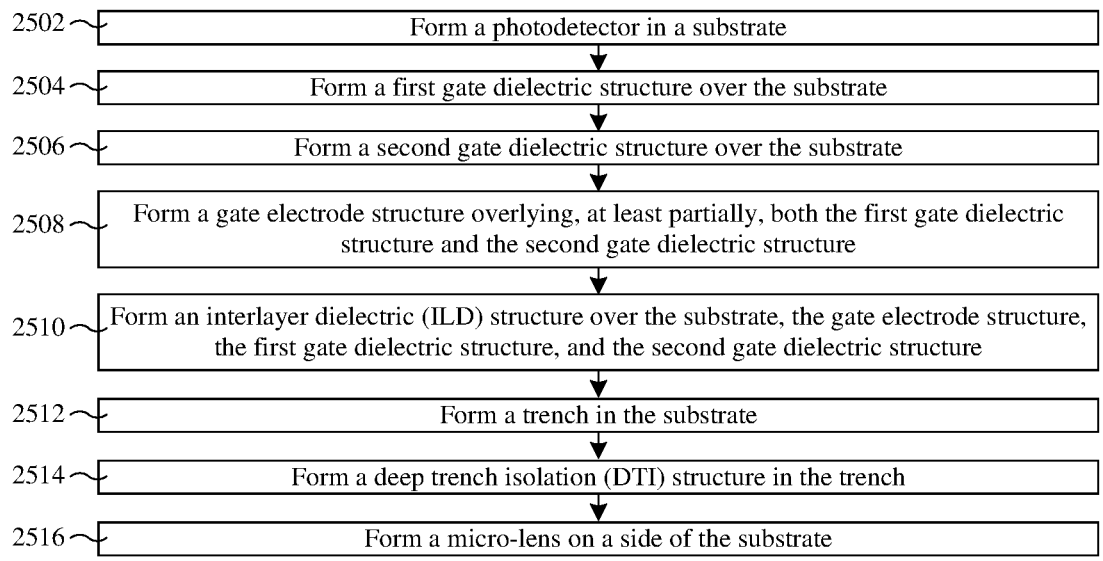
FIG. 25 illustrates a flowchart of some embodiments of a method for forming an image sensor comprising a first gate dielectric structure having a first thickness and a second gate dielectric structure having a second thickness greater than the first thickness.

FIG. 25 illustrates a flowchart 2500 of some embodiments of a method for forming an image sensor comprising a first gate dielectric structure having a first thickness and a second gate dielectric structure having a second thickness greater than the first thickness. While the flowchart 2500 of FIG. 25 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2502, a photodetector is formed in a substrate. FIG. 12 illustrates a cross-sectional view 1200 of some embodiments corresponding to act 2502.

At act 2504, a first gate dielectric structure is formed over the substrate. FIGS. 13-14 illustrate a series of cross-sectional views 1300-1400 of some embodiments corresponding to act 2504.

At act 2506, a second gate dielectric structure is formed over the substrate. FIGS. 13-14 illustrate a series of cross-sectional views 1300-1400 of some embodiments corresponding to act 2506.

At act 2508, a gate electrode structure is formed overlying, at least partially, both the first gate dielectric structure and the second gate dielectric structure. FIG. 15 illustrates a cross-sectional view 1500 of some embodiments corresponding to act 2508.

At act 2510, an interlayer dielectric (ILD) structure is formed over the substrate, the gate electrode structure, the first gate dielectric structure, and the second gate dielectric structure. FIGS. 16-18 illustrate a series of cross-sectional views 1600-1800 of some embodiments corresponding to act 2510.

At act 2512, a trench is formed in the substrate. FIG. 19 illustrates a cross-sectional view 1900 of some embodiments corresponding to act 2512.

At act 2514, a deep trench isolation (DTI) structure is formed in the trench. FIG. 20 illustrates a cross-sectional view 2000 of some embodiments corresponding to act 2514.

At act 2516, a micro-lens is formed on a side of the substrate. FIGS. 21-24 illustrate a series of cross-sectional views 2100-2400 of some embodiments corresponding to act 2516.

In some embodiments, the present application provides an image sensor. The image sensor comprises a deep trench isolation (DTI) structure disposed in a semiconductor substrate, wherein the DTI structure extends laterally through the semiconductor substrate in a closed loop path, and wherein a pixel region of the semiconductor substrate is disposed within an inner perimeter of the DTI structure. A photodetector is disposed in the pixel region of the semiconductor substrate. A gate electrode structure partially overlies the pixel region of the semiconductor substrate. A first gate dielectric structure partially overlies the pixel region of the semiconductor substrate. A second gate dielectric structure partially overlies the pixel region of the semiconductor substrate, wherein the gate electrode structure overlies both a portion of the first gate dielectric structure and a portion of the second gate dielectric structure, and wherein a thickness of the portion of the second gate dielectric structure is greater than a thickness of the portion of the first gate dielectric structure.

In some embodiments, a dielectric structure is disposed over the semiconductor substrate, the first gate dielectric structure, the second gate dielectric structure, and the gate electrode structure. A conductive contact is disposed in the dielectric structure and electrically coupled to the gate electrode structure, wherein the conductive contact overlies the portion of the second gate dielectric structure.

In some embodiments, the conductive contact is disposed within the inner perimeter of the DTI structure.

In some embodiments, the conductive contact at least partially overlies the DTI structure.

In some embodiments, the second gate dielectric structure has a sidewall disposed laterally between a first sidewall of the gate electrode structure and a second sidewall of the gate electrode structure. The first sidewall of the gate electrode structure is opposite the second sidewall of the gate electrode structure. The first sidewall of the gate electrode structure faces a sidewall of the DTI structure. The conductive contact is disposed laterally between the sidewall of the second gate dielectric structure and the sidewall of the DTI structure.

In some embodiments, the second gate dielectric structure laterally surrounds the first gate dielectric structure.

In some embodiments, an outer perimeter of the first gate dielectric structure is disposed within the inner perimeter of the DTI structure.

In some embodiments, a floating diffusion node is disposed in the pixel region of the semiconductor substrate, wherein the floating diffusion node is disposed within an outer perimeter of the first gate dielectric structure.

In some embodiments, the gate electrode structure has a first portion overlying the portion of the first gate dielectric structure. The gate electrode structure has a second portion overlying the portion of the second gate dielectric structure. The height of the first portion of the gate electrode structure is greater than a height of the second portion of the gate electrode structure.

In some embodiments, a sidewall spacer is disposed along sidewalls of the gate electrode structure, wherein a first portion of the sidewall spacer overlies the first gate dielectric structure, wherein a second portion of the sidewall spacer overlies the second gate dielectric structure, and wherein a height of the first portion of the sidewall spacer is greater than a height of the second portion of the sidewall spacer.

In some embodiments, the semiconductor substrate has a first surface and a second surface opposite the first surface. The first surface of the semiconductor substrate is disposed vertically between the gate electrode structure and the second surface of the semiconductor substrate. The first surface of the semiconductor substrate is disposed vertically between a surface of the DTI structure and the second surface of the semiconductor substrate.

In some embodiments, the DTI structure extends vertically through the semiconductor substrate from the first surface of the semiconductor substrate to the second surface of the semiconductor substrate.

In some embodiments, the present application provides an image sensor. The image sensor comprises an isolation structure disposed in a semiconductor substrate, wherein the isolation structure extends vertically through the semiconductor substrate from a first surface of the semiconductor substrate to a second surface of the semiconductor substrate opposite the first surface of the semiconductor substrate. A floating diffusion node is disposed in the semiconductor substrate and on a side of the isolation structure. A photodetector is disposed in the semiconductor substrate and laterally between the floating diffusion node and the isolation structure. A gate electrode structure is disposed over the semiconductor substrate and laterally between the floating diffusion node and the photodetector, wherein the first surface of the semiconductor substrate is disposed vertically between the gate electrode structure and the second surface of the semiconductor substrate. A first gate dielectric structure is disposed over the first surface of the semiconductor substrate. A second gate dielectric structure is disposed over the first surface of the semiconductor substrate and on a side of the first gate dielectric structure, wherein a thickness of the second gate dielectric structure is greater than a thickness of the first gate dielectric structure, wherein the second gate dielectric structure overlies the isolation structure, and wherein the gate electrode structure partially overlies both the first gate dielectric structure and the second gate dielectric structure.

In some embodiments, a dielectric structure is disposed over the semiconductor substrate, the first gate dielectric structure, the second gate dielectric structure, and the gate electrode structure. A conductive contact is disposed in the dielectric structure and electrically coupled to the gate electrode structure, wherein the conductive contact is disposed laterally between a sidewall of the second gate dielectric structure and a sidewall of the isolation structure In some embodiments, a first sidewall of the gate electrode structure is substantially aligned with the sidewall of the isolation structure.

In some embodiments, the first sidewall of the gate electrode structure is opposite a second sidewall of the gate electrode structure. The first sidewall of the gate electrode structure has a first length. The second sidewall of the gate electrode structure has a second length greater than the first length.

In some embodiments, a dielectric structure is disposed over the semiconductor substrate, the first gate dielectric structure, the second gate dielectric structure, and the gate electrode structure. A conductive contact is disposed in the dielectric structure and electrically coupled to the gate electrode structure, wherein the conductive contact partially overlies the isolation structure.

In some embodiments, a sidewall of the second gate dielectric structure is disposed laterally between a first sidewall of the gate electrode structure and a second sidewall of the gate electrode structure. The first sidewall of the gate electrode structure is opposite the second sidewall of the gate electrode structure. The isolation structure is disposed laterally between the sidewall of the second gate dielectric structure and the first sidewall of the gate electrode structure.

In some embodiments, the present application provides a method for forming an image sensor. The method comprises forming a photodetector in a semiconductor substrate. A first gate dielectric structure is formed over a first side of the semiconductor substrate. A second gate dielectric structure is formed over the first side of the semiconductor substrate, wherein the second gate dielectric structure is formed with a thickness that is greater than a thickness of the first gate dielectric structure. A gate electrode structure is formed partially over the first gate dielectric structure and is formed partially over the second gate dielectric structure. A trench is formed in the semiconductor substrate that exposes a portion of the second gate dielectric structure, wherein the trench is formed from a second side of the semiconductor substrate opposite the first side of the semiconductor substrate. A back-side deep trench isolation (BDTI) structure is formed in the trench.

In some embodiments, an interlayer dielectric (ILD) structure is formed over the semiconductor substrate, the first gate dielectric structure, the second gate dielectric structure, and the gate electrode structure. A conductive contact is formed in the ILD structure and is formed electrically coupled to the gate electrode structure, wherein the gate electrode structure has opposite sidewalls, wherein the conductive contact is formed laterally between a sidewall of the opposite sidewalls of the gate electrode structure and a sidewall of the second gate dielectric structure, and wherein the sidewall of the second gate dielectric structure faces the first gate dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a deep trench isolation (DTI) structure disposed in a semiconductor substrate, wherein the DTI structure extends laterally through the semiconductor substrate in a closed loop path, and wherein a pixel region of the semiconductor substrate is disposed within an inner perimeter of the DTI structure;
   a photodetector disposed in the pixel region of the semiconductor substrate;
   a gate electrode structure partially overlying the pixel region of the semiconductor substrate;
   a first gate dielectric structure partially overlying the pixel region of the semiconductor substrate; and
   a second gate dielectric structure partially overlying the pixel region of the semiconductor substrate, wherein the gate electrode structure overlies both a portion of the first gate dielectric structure and a portion of the second gate dielectric structure, and wherein a thickness of the portion of the second gate dielectric structure is greater than a thickness of the portion of the first gate dielectric structure.

2. The image sensor of claim 1, further comprising:
   a dielectric structure disposed over the semiconductor substrate, the first gate dielectric structure, the second gate dielectric structure, and the gate electrode structure; and
   a conductive contact disposed in the dielectric structure and electrically coupled to the gate electrode structure, wherein the conductive contact overlies the portion of the second gate dielectric structure.

3. The image sensor of claim 2, wherein the conductive contact is disposed within the inner perimeter of the DTI structure.

4. The image sensor of claim 2, wherein the conductive contact at least partially overlies the DTI structure.

5. The image sensor of claim 2, wherein:
   the second gate dielectric structure has a sidewall disposed laterally between a first sidewall of the gate electrode structure and a second sidewall of the gate electrode structure;
   the first sidewall of the gate electrode structure is opposite the second sidewall of the gate electrode structure;
   the first sidewall of the gate electrode structure faces a sidewall of the DTI structure; and
   the conductive contact is disposed laterally between the sidewall of the second gate dielectric structure and the sidewall of the DTI structure.

6. The image sensor of claim 1, wherein the second gate dielectric structure laterally surrounds the first gate dielectric structure.

7. The image sensor of claim 1, wherein an outer perimeter of the first gate dielectric structure is disposed within the inner perimeter of the DTI structure.

8. The image sensor of claim 1, further comprising:
a floating diffusion node disposed in the pixel region of the semiconductor substrate, wherein the floating diffusion node is disposed within an outer perimeter of the first gate dielectric structure.

9. The image sensor of claim 1, wherein:
the gate electrode structure has a first portion overlying the portion of the first gate dielectric structure;
the gate electrode structure has a second portion overlying the portion of the second gate dielectric structure; and
a height of the first portion of the gate electrode structure is greater than a height of the second portion of the gate electrode structure.

10. The image sensor of claim 1, further comprising:
a sidewall spacer disposed along sidewalls of the gate electrode structure, wherein a first portion of the sidewall spacer overlies the first gate dielectric structure, wherein a second portion of the sidewall spacer overlies the second gate dielectric structure, and wherein a height of the first portion of the sidewall spacer is greater than a height of the second portion of the sidewall spacer.

11. The image sensor of claim 1, wherein:
the semiconductor substrate has a first surface and a second surface opposite the first surface;
the first surface of the semiconductor substrate is disposed vertically between the gate electrode structure and the second surface of the semiconductor substrate; and
the first surface of the semiconductor substrate is disposed vertically between a surface of the DTI structure and the second surface of the semiconductor substrate.

12. The image sensor of claim 11, wherein the DTI structure extends vertically through the semiconductor substrate from the first surface of the semiconductor substrate to the second surface of the semiconductor substrate.

13. An image sensor comprising:
an isolation structure disposed in a semiconductor substrate, wherein the isolation structure extends vertically through the semiconductor substrate from a first surface of the semiconductor substrate to a second surface of the semiconductor substrate opposite the first surface of the semiconductor substrate;
a floating diffusion node disposed in the semiconductor substrate and on a side of the isolation structure;
a photodetector disposed in the semiconductor substrate and laterally between the floating diffusion node and the isolation structure;
a gate electrode structure disposed over the semiconductor substrate and laterally between the floating diffusion node and the photodetector, wherein the first surface of the semiconductor substrate is disposed vertically between the gate electrode structure and the second surface of the semiconductor substrate;
a first gate dielectric structure disposed over the first surface of the semiconductor substrate; and
a second gate dielectric structure disposed over the first surface of the semiconductor substrate and on a side of the first gate dielectric structure, wherein a thickness of the second gate dielectric structure is greater than a thickness of the first gate dielectric structure, wherein the second gate dielectric structure overlies the isolation structure, and wherein the gate electrode structure partially overlies both the first gate dielectric structure and the second gate dielectric structure.

14. The image sensor of claim 13, further comprising:
a dielectric structure disposed over the semiconductor substrate, the first gate dielectric structure, the second gate dielectric structure, and the gate electrode structure; and
a conductive contact disposed in the dielectric structure and electrically coupled to the gate electrode structure, wherein the conductive contact is disposed laterally between a sidewall of the second gate dielectric structure and a sidewall of the isolation structure.

15. The image sensor of claim 14, wherein a first sidewall of the gate electrode structure is substantially aligned with the sidewall of the isolation structure.

16. The image sensor of claim 15, wherein:
the first sidewall of the gate electrode structure is opposite a second sidewall of the gate electrode structure;
the first sidewall of the gate electrode structure has a first length; and
the second sidewall of the gate electrode structure has a second length greater than the first length.

17. The image sensor of claim 13, further comprising:
a dielectric structure disposed over the semiconductor substrate, the first gate dielectric structure, the second gate dielectric structure, and the gate electrode structure; and
a conductive contact disposed in the dielectric structure and electrically coupled to the gate electrode structure, wherein the conductive contact partially overlies the isolation structure.

18. The image sensor of claim 17, wherein:
a sidewall of the second gate dielectric structure is disposed laterally between a first sidewall of the gate electrode structure and a second sidewall of the gate electrode structure;
the first sidewall of the gate electrode structure is opposite the second sidewall of the gate electrode structure; and
the isolation structure is disposed laterally between the sidewall of the second gate dielectric structure and the first sidewall of the gate electrode structure.

19. A method for forming an image sensor, the method comprising:
forming a photodetector in a semiconductor substrate;
forming a first gate dielectric structure over a first side of the semiconductor substrate;
forming a second gate dielectric structure over the first side of the semiconductor substrate, wherein the second gate dielectric structure is formed with a thickness that is greater than a thickness of the first gate dielectric structure;
forming a gate electrode structure partially over the first gate dielectric structure and partially over the second gate dielectric structure;
forming a trench in the semiconductor substrate that exposes a portion of the second gate dielectric structure, wherein the trench is formed from a second side of the semiconductor substrate opposite the first side of the semiconductor substrate; and
forming a back-side deep trench isolation (BDTI) structure in the trench.

20. The method of claim 19, further comprising:
forming an interlayer dielectric (ILD) structure over the semiconductor substrate, the first gate dielectric structure, the second gate dielectric structure, and the gate electrode structure; and forming a conductive contact in the ILD structure and electrically coupled to the gate electrode structure, wherein the gate electrode structure has opposite sidewalls, wherein the conductive contact is formed laterally between a first sidewall of the opposite sidewalls of the gate electrode structure and a sidewall of the second gate dielectric structure, and wherein the sidewall of the second gate dielectric structure faces the first gate dielectric structure.

* * * * *